US011520240B2

(12) United States Patent
Mirin et al.

(10) Patent No.: US 11,520,240 B2
(45) Date of Patent: Dec. 6, 2022

(54) WAFER ALIGNMENT MARKERS, SYSTEMS, AND RELATED METHODS

(71) Applicant: Micron Technology, Inc., Boise, ID (US)

(72) Inventors: Nikolay A. Mirin, Boise, ID (US); Robert Dembi, Boise, ID (US); Richard T. Housley, Boise, ID (US); Xiaosong Zhang, Boise, ID (US); Jonathan D. Harms, Meridian, ID (US); Stephen J. Kramer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/314,410

(22) Filed: May 7, 2021

(65) Prior Publication Data
US 2021/0263429 A1 Aug. 26, 2021

Related U.S. Application Data

(62) Division of application No. 16/122,062, filed on Sep. 5, 2018, now Pat. No. 11,009,798.

(51) Int. Cl.
*G03F 7/20* (2006.01)
*H01L 21/68* (2006.01)
(Continued)

(52) U.S. Cl.
CPC ....... *G03F 7/70633* (2013.01); *G01R 33/072* (2013.01); *G03F 7/70683* (2013.01);
(Continued)

(58) Field of Classification Search
CPC ..... G01R 27/2605; G01R 15/16; G06F 3/044; G06F 2203/04103; G06F 3/0416
(Continued)

(56) References Cited

U.S. PATENT DOCUMENTS 4,072,200 A 2/1978 Morris et al.
4,933,640 A 6/1990 Kuckes
(Continued)

FOREIGN PATENT DOCUMENTS

CN 1991586 A 3/2012
CN 202189227 U 4/2012
(Continued)

OTHER PUBLICATIONS

Cheung, N., EE143 Microfabrication Technologies Fall 2010 Lecture Notes, Nov. 4, 2010, http://www-inst.eecs.berkeley.edu/~ee143/fa10/lectures/Lec_20.pdf, 21 pages.
(Continued)

*Primary Examiner* — Giovanni Astacio-Oquendo
(74) *Attorney, Agent, or Firm* — TraskBritt

(57) ABSTRACT

A method of aligning a wafer for semiconductor fabrication processes may include applying a magnetic field to a wafer, detecting one or more residual magnetic fields from one or more alignment markers within the wafer, responsive to the detected one or more residual magnetic fields, determining locations of the one or more alignment markers. The marker locations may be determined relative to an ideal grid, followed by determining a geometrical transformation model for aligning the wafer, and aligning the wafer responsive to the geometrical transformation model. Related methods and systems are also disclosed.

20 Claims, 13 Drawing Sheets

(51) Int. Cl.
*G01R 33/07* (2006.01)
*H01L 23/544* (2006.01)

(52) U.S. Cl.
CPC ............ *H01L 21/68* (2013.01); *H01L 23/544* (2013.01); *H01L 2223/54426* (2013.01)

(58) Field of Classification Search
USPC ................................ 324/679, 658, 686, 661
See application file for complete search history.

(56) References Cited

U.S. PATENT DOCUMENTS

| | | | |
|---|---|---|---|
| 6,049,974 | A | 4/2000 | Asanasavest |
| 6,068,954 | A | 5/2000 | David |
| 6,778,275 | B2 | 8/2004 | Bowes |
| 6,779,171 | B2 | 8/2004 | Baggenstoss |
| 6,822,342 | B2 | 11/2004 | Baluswamy et al. |
| 7,046,001 | B2 | 5/2006 | Tada et al. |
| 7,112,960 | B2 | 9/2006 | Miller et al. |
| 7,181,057 | B2 | 2/2007 | Adel et al. |
| 7,463,367 | B2 | 12/2008 | Bowes |
| 7,804,993 | B2 * | 9/2010 | Dorphan ............ G01N 21/9501 382/254 |
| 8,313,877 | B2 | 11/2012 | Chung |
| 8,400,634 | B2 | 3/2013 | Zhou et al. |
| 8,408,965 | B2 | 4/2013 | Bennett et al. |
| 9,023,667 | B2 | 5/2015 | Iravani et al. |
| 9,748,128 | B1 | 8/2017 | Chao et al. |
| 10,217,637 | B1 | 2/2019 | Budd et al. |
| 2002/0054703 | A1 | 5/2002 | Hiroi et al. |
| 2002/0062992 | A1 | 5/2002 | Fredericks et al. |
| 2004/0165195 | A1 | 8/2004 | Sato et al. |
| 2005/0072528 | A1 | 4/2005 | Owczarz et al. |
| 2006/0145690 | A1 | 7/2006 | Shoji |
| 2009/0170024 | A1 | 7/2009 | Hennig et al. |
| 2009/0284837 | A1 * | 11/2009 | Lake ................ B29D 11/00365 359/619 |
| 2010/0114522 | A1 | 5/2010 | Chung |
| 2011/0084412 | A1 * | 4/2011 | Brenna ................... H01L 21/82 257/E23.179 |
| 2011/0299054 | A1 | 12/2011 | Van De Rijdt et al. |
| 2012/0049839 | A1 | 3/2012 | Kiendl |
| 2012/0313236 | A1 | 12/2012 | Wakiyama et al. |
| 2016/0139221 | A1 | 5/2016 | Overweg |
| 2016/0170317 | A1 | 6/2016 | Li et al. |
| 2017/0213864 | A1 | 7/2017 | Chen et al. |
| 2017/0278783 | A1 | 9/2017 | Agrawal et al. |
| 2018/0114756 | A1 | 4/2018 | Zhang et al. |
| 2018/0122669 | A1 | 5/2018 | Wu et al. |
| 2018/0136570 | A1 | 5/2018 | Zeng et al. |
| 2018/0138396 | A1 | 5/2018 | Nagel |
| 2019/0035699 | A1 | 1/2019 | Lu et al. |
| 2020/0381319 | A1 * | 12/2020 | Tang ........................ H01L 22/32 |
| 2020/0411447 | A1 * | 12/2020 | Zhang ............... H01L 21/68785 |
| 2021/0263429 | A1 * | 8/2021 | Mirin .................. G03F 7/70633 |

FOREIGN PATENT DOCUMENTS

| | | |
|---|---|---|
| CN | 106463380 A | 10/2019 |
| EP | 3316039 A2 | 5/2018 |

OTHER PUBLICATIONS

Hawkins, Aaron R., Contact Photolithographic Alignment Tutorial, Electrical and Computer Engineering Department, Brigham Young University, (Jan. 2004), 9 pages.

KLA Tencor, Metrology, https://www.kla-tencor.com/products/chip-manufacturing/metrology_html, visited May 24, 2018, 12 pages.

Petruska et al., Optimal Permanent-Magnet Geometries for Dipole Field Approximation, IEEE Transactions on Magnetics, vol. 49, Issue 2, (Feb. 2013), pp. 811-819.

Seidel et al., In-Die Photomask Registration and Overlay Metrology with Prove <R> Using 2D Correlation Methods, Proc. of SPIE, vol. 8166, (2011), 8166E-1-81661E-13.

Wikipedia, Photolithography, https://en.wikipedia.org/wiki/Photolithography, visited Jun. 4, 2018, 10 pages.

* cited by examiner

WAFER ALIGNMENT MARKERS, SYSTEMS, AND RELATED METHODS

CROSS-REFERENCE TO RELATED APPLICATIONS

This application is a divisional of U.S. patent application Ser. No. 16/122,062, filed Sep. 5, 2018, now U.S. Pat. No. 11,009,798, issued May 18, 2021, which is related to U.S. patent application Ser. No. 16/122,106, filed Sep. 5, 2018, now U.S. Pat. No. 11,251,096, issued Feb. 15, 2022, titled "WAFER REGISTRATION AND OVERLAY MEASUREMENT SYSTEMS AND RELATED METHODS," the entire disclosure of each of which is hereby incorporated herein by this reference.

TECHNICAL FIELD

This disclosure relates generally to alignment markers, and to methods of and systems for aligning wafers using alignment markers and, more specifically, to employing alignment markers exhibiting ferromagnetic or antiferromagnetic characteristics, as well as alignment markers exhibiting active responses to external magnetic stimuli.

BACKGROUND

Photolithography is a process commonly used in semiconductor fabrication for selectively removing portions of a material from discrete areas of a surface of a semiconductor wafer. A typical photolithography process includes spin coating a layer of a radiation-sensitive material (commonly referred to as a "photoresist") onto the surface of the semiconductor wafer. The semiconductor wafer is then exposed to a pattern of radiation that chemically modifies a portion of the photoresist incident to the radiation. The process further includes removing either the exposed portion, in the case of a positive photoresist, or the unexposed portion, in the case of a negative photoresist, from the surface of the semiconductor wafer with a chemical solution (e.g., a "developer") to form a pattern of openings corresponding to the pattern of radiation. Subsequently, portions of the material on the surface of the semiconductor wafer exposed through the openings can be selectively removed. Alternatively, portions of a material can be deposited onto the surface of the wafer, through the openings of the photoresist mask. The photolithography process can be repeated to form levels of microelectronic features on or in the wafer.

A significant issue in semiconductor processing is precise alignment of a semiconductor wafer with respect to a processing tool, and in particular, photolithography tools. Modern integrated circuits have multiple levels comprising a variety of materials (e.g., 30 or more) that need to be aligned precisely as the multiple levels are formed on the wafer. Conventionally, alignment markers are formed before a current photolithography step, and may occur at any previous step, and not necessarily at a beginning of a fabrication process. The alignment markers provide an optically readable indicator of reference points or reference structures on an active surface of a wafer, and are used to determine the relative orientation of the wafer with respect to a processing tool for precise alignment of levels of material of integrated circuitry being fabricated. However, typical fabrication and packaging processes, such as oxide growth, planarization, or metal deposition, often change critical features of the markers. For example, deposition processes, oxide growth, and removal processes can change markers that start out as trenches to mesas, or the processes can alter the color, contrast, or other properties of the markers used for alignment purposes. Such changes in the alignment markers may cause artifact in optically readings of the marker, resulting in misalignment among superimposed levels, which in turn can cause short-circuiting, misaligned contacts, misaligned vias, disconnections, and other structural deficiencies leading to failure of semiconductor dice singulated from the wafer.

One optical alignment method is manual alignment. Operators using a microscope view the position of a wafer and make adjustments as needed by using a computer that controls an actuator to move a wafer support carrying the wafer. This method is slow, inaccurate, and has a high yield loss due to misalignment even among the most conscientious operators. Other methods such as wafer probing and mechanically scanning point sensors have automated the manual process. However, these methods continue to produce wafers with high yield loss or devices that malfunction due to misalignment and are limited by optical visibility of markers.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein.

DETAILED DESCRIPTION

Figure 1:
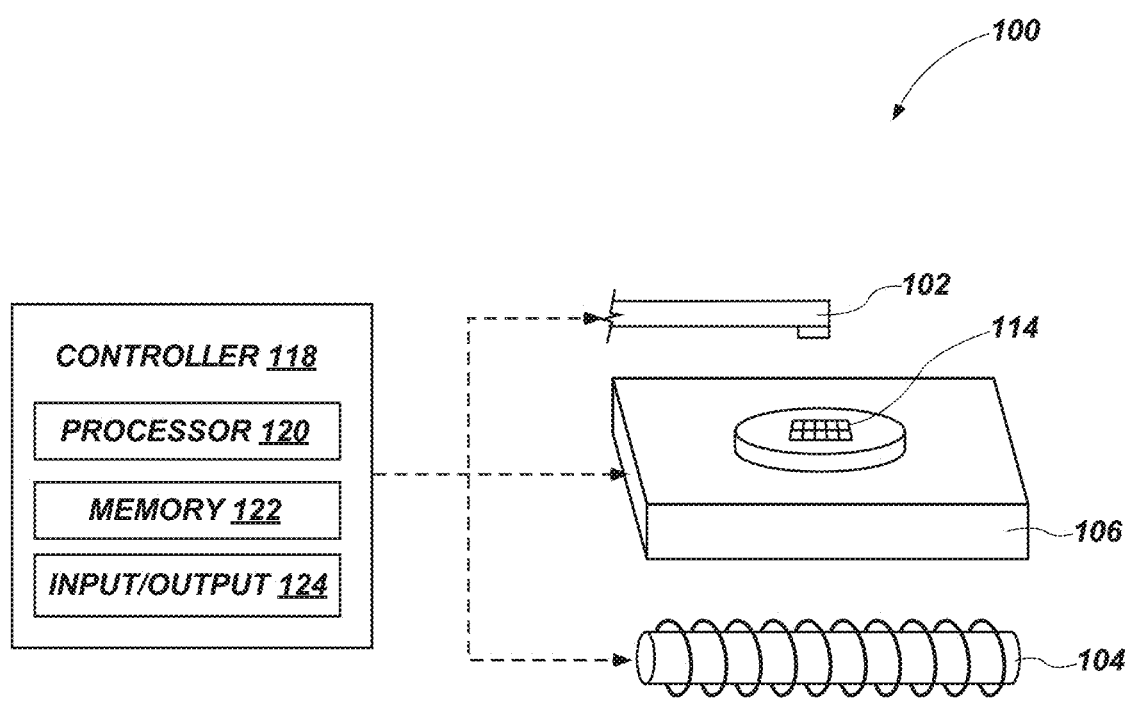
FIG. 1 is a schematic representation of an alignment system according to one or more embodiments of the present disclosure.

The illustrations presented herein are not actual views of any alignment system or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," "above," "upper," etc., is used for clarity and convenience in understanding the disclosure and accompanying drawings, and does not connote or depend on any specific preference or order, except where the context clearly indicates otherwise. For example, these terms may refer to orientations of elements of an alignment system and/or wafer in conventional orientations. Furthermore, these terms may refer to orientations of elements of an alignment system and/or wafer as illustrated in the drawings.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

As used herein, the term "wafer" means and includes materials upon which and in which structures including feature dimensions of micrometer and nanometer scale are partially or completely fabricated. Such materials include conventional semiconductor (e.g., silicon) wafers, as well as bulk substrates of other semiconductor materials as well as other materials. For the sake of convenience, such materials will be referenced below as "wafers." Example structures formed on such materials may include, for example, integrated circuitry (active and passive), MEMS devices, and combinations thereof.

Many details of certain embodiments are described below with reference to semiconductor devices. The term "semiconductor device" is used throughout to include a variety of articles of manufacture, including, for example, individual integrated circuit dies, imager dies, sensor dies, and/or dies having other semiconductor features. The semiconductor device or semiconductor device portions (e.g., semiconductor device forms) may be unsingulated silicon comprising die locations, or a carrier semiconductor device repopulated with previously singulated dice. The repopulated carrier semiconductor device can include an adhesive molding material (e.g., a flexible adhesive), which is surrounded by a generally rigid frame having a perimeter shape comparable to that of device wafer, and laterally separated singulated elements (e.g., dies) surrounded by the molding material.

Some embodiments of the present disclosure include alignment systems and methods for aligning a wafer at least partially based on detecting and/or measuring magnetic attributes of alignment markers within the wafer. For example, some embodiments include alignment systems and methods for forming alignment markers within wafer with ferromagnetic or antiferromagnetic materials or any other material or structure capable of interacting with a magnetic field, and applying a magnetic field to the wafer to magnetize the alignment marker. Moreover, the alignment systems may detect one or more residual magnetic fields from, magnetizations of, or signals from one or more alignment markers within the wafer, and responsive to the detected one or more residual magnetic fields, magnetization, and/or signals, the alignment systems may determine actual locations of the alignment markers relative to an ideal grid of such markers. Furthermore, responsive to the determined locations, the alignment systems may determine a geometrical transformation model to compensate for deviations in alignment marker placement from the ideal for aligning the wafer and may align the wafer responsive to the geometrical transformation model.

FIG. 1 is a schematic view of an alignment system 100 according to one or more embodiments of the present disclosure. The alignment system 100 can be used to align a wafer and for the performance of processes for semiconductor fabrication, for example, photolithographic processes involving selective exposure of a material on the wafer to light through a patterned reticle. It will be appreciated that the present technology is not limited to use in conjunction with photolithography tools but is also applicable to other semiconductor processing tools that require accurate alignment of a wafer relative to the processing tool or other elements (e.g., registration systems and overlay measurements). As a non-limiting example, the present technology can be used in conjunction with laser cutting and drilling tools, saws, 3-D printing tools, and other processes that necessitate precise alignment of wafers. For purposes of illustration, the alignment system 100 includes a sensor 102, a magnetic source 104, and a substrate support 106.

As shown in FIG. 1, a controller 118 may be operatively coupled to the sensor 102, the magnetic source 104, and the substrate support 106 of the alignment system 100 for monitoring or controlling the operation of these components. Although not shown in FIG. 1, the alignment system 100 may also have associated therewith a substrate transport station, a structural support (e.g., a reticle support, a lens support, etc.), position sensors (e.g., a scatterometer), an immersion hood, a support actuator (e.g., an electric motor), and/or other suitable mechanical and/or electrical components. In general, the controller 118 may move a wafer and/or components of the alignment system 100 before, during, and/or after a semiconductor fabrication process. For example, a wafer 114 can undergo photoresist application, patterning, developing, baking, cleaning, deposition or formation of additional material levels, and/or other suitable processing, and the alignment system 100 may be used to align the wafer 114 and/or tool components associated with the alignment system 100 before, during, and/or after these processes.

The controller 118 may include a processor 120 coupled to a memory 122 and an input/output component 124. The processor 120 may include a microprocessor, a field-programmable gate array, and/or other suitable logic devices. The memory 122 may include volatile and/or nonvolatile media (e.g., ROM, RAM, magnetic disk storage media, optical storage media, flash memory devices, and/or other suitable storage media) and/or other types of computer-readable storage media configured to store data. The memory 122 may store algorithms for alignment, edge detection, processing data related to detected magnetic fields and detected magnetizations, emitting magnetic fields, filters, and shape recognition to be executed by the processor 120. In some embodiments, the processor 120 is operably coupled to send data to a computing device operatively coupled (e.g., over the Internet) to the controller 118, such as a server or personal computer. The input/output component 124 can include a display, a touch screen, a keyboard, a mouse, and/or other suitable types of input/output devices configured to accept input from and provide output to an operator.

In the embodiment illustrated in FIG. 1, the alignment system 100 may utilize the sensor 102 to determine (e.g., read) locations of alignment markers disposed within a wafer and send captured location data to the controller 118, where it is stored in the memory 122, processed by the processor 120, and/or sent to the input/output component 124. As is discussed in greater detail below, the alignment system 100 may utilize the sensor 102 to detect one or more magnetic attributes of alignment markers within the wafer 114. In some embodiments, the alignment system 100 may utilize the sensor 102 to detect the locations of magnetic fields emitted by the alignment markers disposed within the wafer, and responsive to the detected magnetic field locations, the alignment system 100 may determine the locations of the alignment markers disposed in the wafer, as is described in greater detail below in regard to FIGS. 3-9. In additional embodiments, the photolithography system 100 may utilize the sensor 102 to measure magnetization field strength of the respective alignment markers disposed within the wafer, and responsive to the measured field strengths of the respective alignment markers, the alignment system 100 may determine the locations of the alignment markers disposed in the wafer, as is described in greater detail below in regard to FIGS. 10-12. In yet further embodiments, the alignment system 100 may utilize the sensor 102 to detect responses from alignment markers (in this case, circuits) powered inductively by the magnetic source 104, and based at least in part on the responses, the alignment system 100 may determine the locations of the alignment markers disposed in the wafer, as is described in greater detail below in regard to FIG. 13. Furthermore, the alignment system 100 may utilize the determined locations of the alignment markers to align the wafer 114 for further semiconductor fabrication processing (e.g., exposure procedures). For instance, the alignment system 100 may utilize the determined locations of the alignment markers to align the wafers in conjunction with conventional methods for aligning wafer with alignment markers.

In some embodiments, the sensor 102 may include a magnetic sensor. In one or more embodiments, the sensor 102 may include a Hall Effect sensor. For instance, the sensor 102 may include a transducer that varies the transducer's output voltage in response to a detected magnetic field. In additional embodiments, the sensor 102 may include one or more of a giant magnetoresistance (GMR) sensor, a tunnel magnetoresistance (TMR) sensor, an electromagnetic radiation (EMR) sensor, or a spin hall sensor. In further embodiments, the sensor 102 may include a magnetic force microscopy (MFM) probe (e.g., a magnetic force microscope). For instance, the sensor 102 may include a sharp magnetized tip for scanning the alignment markers, where interactions between the tip and the alignment markers (e.g., deflections of the tip) are detected and utilized to reconstruct magnetic structures of the alignment markers. In some embodiments, the sensor 102 may include one or more of a superconducting quantum interference device (SQUID) or a vibrating sample magnetometer (VSM). The operation of the sensor 102 is described in greater detail below in regard to FIGS. 4, 5, 11, and 12.

The alignment system 100 may utilize the magnetic source 104 to apply a magnetic field to the wafer 114 (e.g., emit a magnetic field through the material of wafer 114) and any alignment markers included within the wafer 114, to magnetize the alignment markers within the wafer 114, and/or to power the alignment markers within the wafer 114. In some embodiments, the magnetic source 104 may include a permanent magnet. In additional embodiments, the magnetic source 104 may include an electromagnet. For instance, the magnetic source 104 may include any electromagnet known in the art. Furthermore, in some embodiments, the magnetic source 104 may be sized and shaped for applying a magnetic field to an entirety of the wafer 114 (e.g., all the alignment markers within the wafer 114). In other embodiments, the magnetic source 104 may be sized and shaped for applying a magnetic field to only selected portions of the wafer 114 (e.g., a group of alignment markers, a region of the wafer 114, etc.). In one or more embodiments, the magnetic source 104 may be disposed within a probe carrying the sensor 102. For instance, the magnetic source 104 may include an inductor disposed proximate to the sensor 102, to be used to magnetize alignment markers in their respective locations without subjecting the entire wafer to magnetic fields and prior to use of sensor 102 on the probe. In other embodiments, magnetic source 104 may be omitted, and wafer 114 subjected to a magnetic source after alignment markers 202 are formed and before placement of wafer 114 on the substrate support of photolithography system 100. In further embodiments, the magnetic source 104 may be carried on a probe moveable under wafer 114 in alignment with a probe carrying sensor 102 to stimulate a response from each marker aligned between the sensor 102 and the magnetic source 104.

The substrate support 106 may be configured to carry and/or move the wafer 114. The substrate support 106, which may also be characterized as a platform or a stage, may include a vacuum chuck, a mechanical chuck, and/or other suitable supporting devices. Although not shown in FIG. 1, the alignment system 100 may include at least one actuator configured to move the substrate support 106 laterally (as indicated by the X-axis), transversely (as indicated by the Y-axis), and/or vertically (as indicated by the Z-axis) relative to the sensor 102 and/or other components of the alignment system 100. As used herein, the X-axis, Y-axis, and Z-axis as depicted in FIG. 1 define a Cartesian space. In certain embodiments, the substrate support 106 can also include position monitors (not shown) such as linear encoders, configured to monitor the position of the substrate support 106 along the X-axis, the Y-axis, and/or the Z-axis. In addition, a rotary encoder may be employed to monitor a rotational position of the wafer about the Z-axis. Even though only one substrate support 106 is shown in FIG. 1, in certain embodiments, the alignment system 100 can include two, three, or any desired number of substrate supports with structures and/or functions that are generally similar to or different than the substrate support 106, so that multiple wafers may be moved into and out of alignment with the remainder of alignment system 100 in an expedited fashion. In operation, the controller 118 may be used to position the substrate support 106 to properly align the wafer 114 with tools or other components associated with the alignment system 100 according to aspects of the present technology described below.

In some embodiments, the alignment system 100 may additionally include components of conventional alignment systems known in the art. For instance, the alignment system 100 may additionally include an optical alignment system (e.g., an optical microscope imaging or scatterometry system) that may be used in conjunction with the alignment system 100 of the present disclosure. As a non-limiting example, the alignment system 100 may include an image sensor, an illumination source, a reticle, a condenser lens, a reticle, and/or an objective lens and may be capable of performing any of the alignment procedures (e.g., alignment models) associated with the foregoing components. For example, the photolithography system 100 may additionally include the alignment system described in U.S. Pat. No. 9,748,128, to Chao et al., issued Aug. 29, 2017.

Figure 2A:
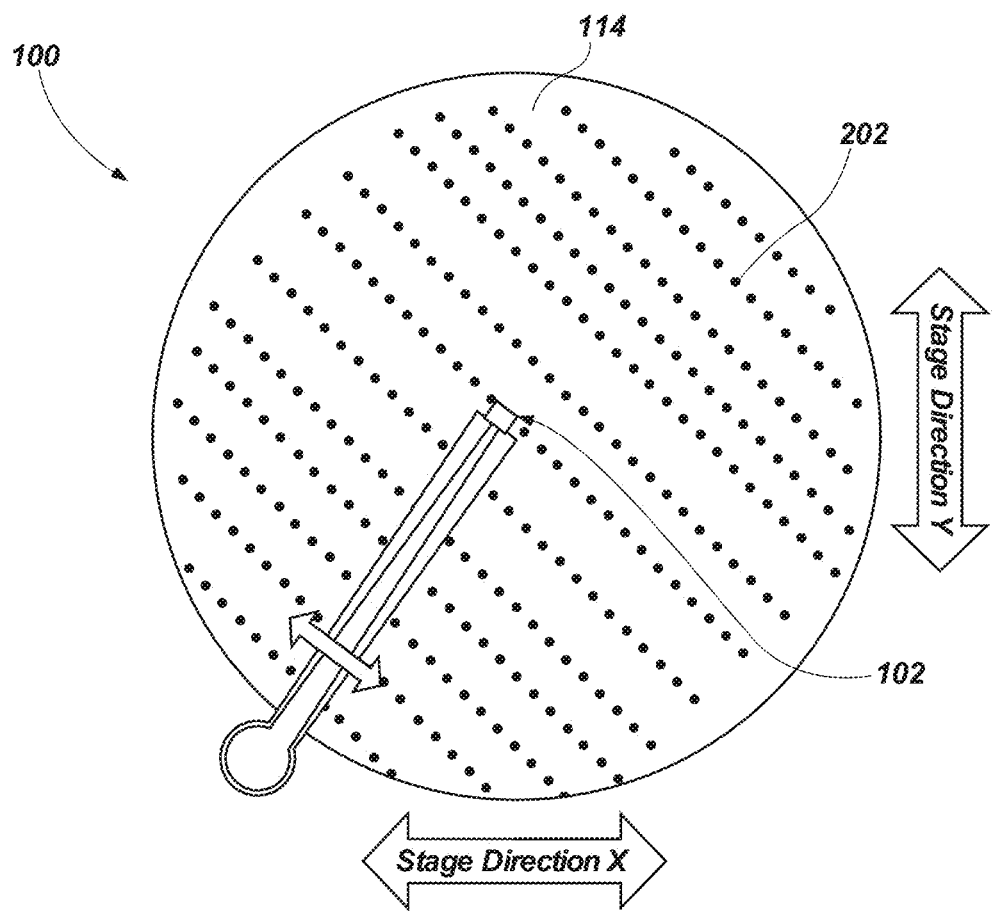
FIG. 2A is a simplified top view of an alignment system superimposed over a wafer having alignment markers formed therein according to one or more embodiments of the present disclosure.
Figure 2B:
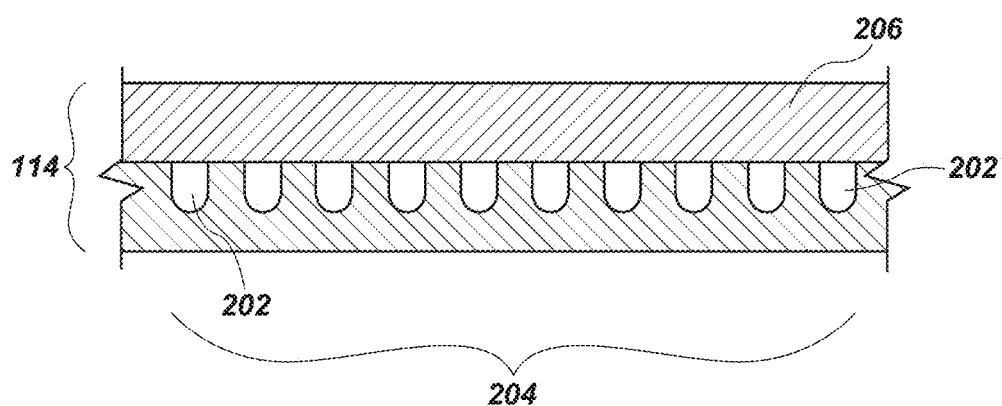
FIG. 2B is a partial side cross-sectional view of a wafer having alignment markers formed therein according to one or more embodiments present disclosure.

FIG. 2A is a schematic top view of a wafer 114 and sensor 102 (e.g., probe) of an alignment system (e.g., alignment system 100) according to one or more embodiments of the present disclosure. FIG. 2B is a schematic partial side cross-sectional view of the wafer 114 of FIG. 2A according to one or more embodiments of the present disclosure. Referring to FIGS. 2A and 2B together, in some embodiments, the wafer 114 may include alignment markers 202 disposed within the wafer 114.

In some embodiments, the alignment markers 202 may be disposed within wafer 114 within a predetermined pattern 204. For instance, the alignment markers 202 may be oriented relative to one another in the pattern 204 to assist in aligning the wafer 114 prior to one or more semiconductor fabrication. Furthermore, as is discussed in greater detail below, the pattern 204 may be formed via conventional methods known in the art. As is depicted in FIG. 2B, in some embodiments, the alignment markers 202 may be disposed in a lower level of processing (e.g., a level created in a previous procedure) of the wafer 114, and now hidden from sight. For instance, as shown in FIG. 2B, the alignment markers 202 may be disposed beneath one or more additional levels 206 (e.g., overlying levels) on an active surface of the wafer 114. In some embodiments, the alignment markers 202 may be disposed beneath one or more opaque and/or relatively thick material levels. For clarity, the one or more additional material levels 206 are removed in FIG. 2A. In some embodiments, the alignment markers may be disposed in an active surface of a pristine semiconductor wafer, prior to any processing for forming integrated circuitry thereon.

In one or more embodiments, the alignment markers 202 may each have a circular cross-section along a plane parallel to an upper surface of the wafer 114. In additional embodiments, the alignment markers 202 may have any other shaped cross-section. For example, the alignment markers 202 may have a general cuboid shape (e.g., flat rectangle shape). Additionally, the alignment markers 202 may have any polygonal shape. Of course, alignment markers on an active surface of a wafer may all have the same shapes, or different shapes.

The one or more alignment markers 202 may include ferromagnetic and/or antiferromagnetic materials or any other material capable of interacting with magnetic fields. As is known in the art, ferromagnetic materials contain unpaired electrons, each with a small magnetic field of its own, that align readily with each other in response to an applied external magnetic field. The alignment of the electrons tends to persist even after the external magnetic field is removed, due to a phenomenon called magnetic hysteresis. In some embodiments, the one or more alignment markers 202 may include one or more of iron, alnico alloys (e.g., iron alloys including aluminum, nickel, and/or cobalt), bismanol (i.e., bismuth and manganese alloy), chromium (IV) oxide, cobalt, fernico alloys, ferrite, gadolinium, gallium manganese arsenide, magnadur (i.e., sintered barium ferrite), magnetite, nickel, etc. In antiferromagnetic materials, magnetic moments of atoms or molecules, usually related to spins of electrons, align in a regular pattern with neighboring spins pointing in opposite directions. Antiferromagnetic materials may comprise transition metal compounds, such as oxides. Examples include hematite, chromium, iron manganese, and nickel oxide.

First Set of Embodiments

Figure 3:
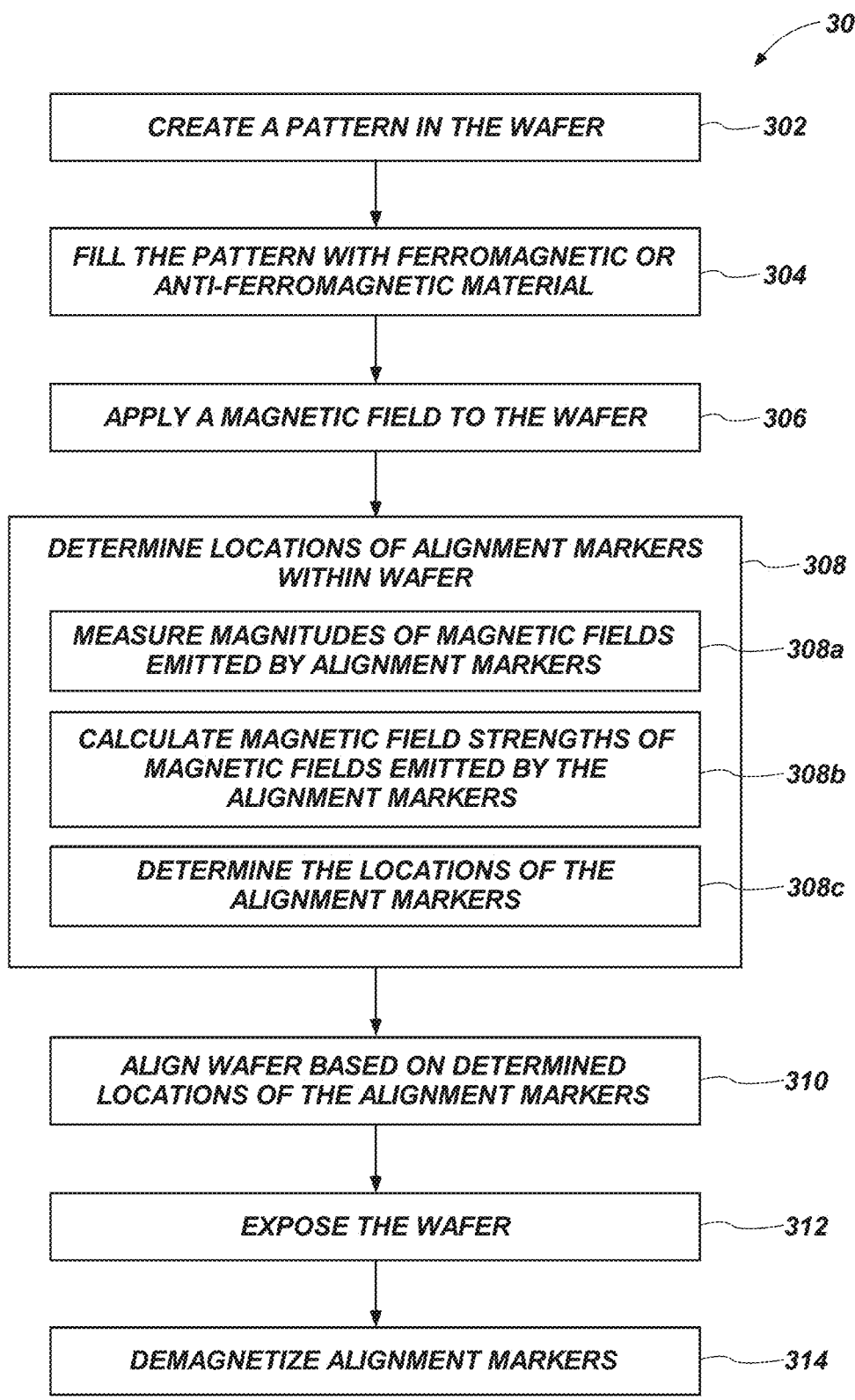
FIG. 3 is a flow diagram of a method of aligning a wafer according to one or more embodiments of the present disclosure.

FIG. 3 shows a schematic flow diagram of a method 300 of aligning a wafer for performance of semiconductor fabrication processes according to a first set of embodiments of the present disclosure. As is described in greater detail below, the first set of embodiments may include procedures that involve determining locations of alignment markers 202 and an overall orientation of a wafer 114 responsive to magnetic fields emitted by the alignment markers 202, and aligning the wafer 114 responsive to the determined locations.

As is shown in FIG. 3, the method 300 may include creating a pattern 204 in a surface (e.g., upper surface) of a wafer 114 by removing material from the semiconductor material of wafer 114, as shown in act 302. In some embodiments, the pattern 204 may be created via conventional lithographic processes and methods. For instance, photo resist application, patterning and etching (chemical or reactive ion etching), or focused ion beam processes (e.g., ion milling), etc., may be employed to form a pattern of recesses in the semiconductor material of wafer 114 prior to further processing of wafer 114 for fabrication of integrated circuitry thereon. Furthermore, in some embodiments, the created pattern 204 may correlate to (e.g., have the same size and shape as a pattern of) an ideal grid (e.g., ideal pattern and ideal position of the alignment markers 202 for orientation of the wafer 114). As is known in the art, positions and locations of alignment markers within a wafer are conventionally compared to an ideal grid to determine alignment procedures and movements (e.g., alignment models).

In some embodiments, the pattern 204 may be formed such that resulting alignment markers 202 (described below in regard to acts 304 and 306) formed within the pattern 204 have a particular orientation and/or geometry. For instance, the pattern 204 may be formed such that resulting alignment markers 202, when magnetized, have poles (e.g., magnetic poles) disposed along a particular axis (e.g., X-axis, Y-axis, or Z-axis) of the Cartesian space defined above in regard to FIG. 1. Additionally, recesses of the pattern 204 may be formed for creation of alignment markers 202 of particular geometric shapes. As a result, the orientations, geometries, and locations of the alignment markers 202 may be predetermined.

In some embodiments, the pattern 204 may be formed such that longitudinal lengths of the resulting alignment markers 202 are at least substantially parallel to one of the X-axis, Y-axis, or Z-axis of the Cartesian space. Furthermore, the alignment system 100 may form the pattern 204 such that each of the resulting alignment markers 202 has a common directional orientation.

The method 300 may also include filling recesses of the pattern 204 with ferromagnetic and/or anti ferromagnetic materials or any other material or structure capable of interacting with a magnetic field to form the alignment markers 202, as shown in act 304 of FIG. 3. For instance, act 304 may include filling recesses of the pattern 204 with any of the materials described above in regard to FIGS. 2A and 2B. Furthermore, recesses of the pattern 204 may be filled via conventional methods. For example, recesses of the pattern 204 may be filled with the desired material via electroplating, electroless plating, physical vapor deposition, chemical vapor deposition, ion beam deposition, thin film deposition, etc. The surface of wafer 114 may then be subjected to a material removal process such as, for example, chemical mechanical planarization (CMP) to remove material from the wafer surface. In alternative embodiments, the method 300 may not include forming one or more recesses in the wafer 114 and then filling the one or more recesses with magnetic material. Rather, the method 300 may include depositing magnetic material on the wafer and patterning the magnetic material directly. In some embodiments, the recesses of the pattern 204 may be filled to enable for greater dry etches and critical path method of critical dimension uniformity while not effecting the alignment markers' 202 performance.

In some embodiments, the alignment markers 202 formed via filling the pattern 204 may include nanostructures. For example, the alignment markers 202 may have at least one dimension on the nanoscale. In additional embodiments, the alignment markers 202 formed via filling the pattern 204 may include microstructures. For instance, the alignment markers 202 may have at least one dimension on the microscale. As a non-limiting example, in one or more embodiments, an alignment marker 202 may include a 500 nm×100 µm×20 µm rectangular prism alignment marker. In additional embodiments, an alignment marker 202 may include a 4 µm×100 µm×20 µm rectangular prism alignment marker. In further embodiments, an alignment marker 202 may include a 500 nm×50 µm×5 µm rectangular prism alignment marker. In yet further embodiments, an alignment marker 202 may include a 1.5 µm×1.5 µm×250 µm pillar alignment marker. Although specific dimensions are described herein, the alignment markers 202 may additionally have any conventional dimension of alignment markers.

After filling the pattern 204 with ferromagnetic and/or anti ferromagnetic materials, deviations of the pattern 204 from an ideal grid may be determined, wafer 114 aligned for processing, and additional semiconductor fabrication processes (e.g., depositing layers, etching, etc.) may be initiated. For example, one or more material levels (e.g., overlying levels) may be formed over the alignment markers 202 of the wafer 114. As a result of subsequent semiconductor fabrication processes and/or movements of the wafer 114 during such processes, known orientations of the wafer 114 and/or orientations and locations of the alignment markers 202 may become inaccurate. As a result, any previously known positions of features on wafer 114 may become inaccurate, and the position of wafer 114 may be recalibrated prior to further processing to secure precise alignment of features created in various additional, superimposed levels.

When initiating an alignment procedure, the method 300 may include applying an external magnetic field to the wafer 114, as shown in act 306. For instance, the alignment system 100 may apply an external magnetic field to the wafer 114 (e.g., subject the wafer 114 to a magnetic field) via the magnetic source 104 described above in regard to FIG. 1. For example, the alignment system 100 may supply a current through a coil of wire wrapped around an iron core to create an external magnetic field. In some embodiments, the alignment system 100 may supply a sufficient amount of current to create an external magnetic field having a strength greater than 25 Oersteds (Oe). In one or more embodiments, the alignment system 100 may apply the external magnetic field to the wafer 114 immediately following filling the pattern 204 with ferromagnetic and/or anti ferromagnetic materials (i.e., act 304 of FIG. 3). In additional embodiments, the alignment system 100 may apply the external magnetic field to the wafer 114 after one or more subsequent semiconductor fabrication processes and prior to or while aligning the wafer 114 before initiating an additional semiconductor fabrication process. In some embodiments, applying the external magnetic field to the wafer 114 is optional. For instance, the alignment markers 202 may already be magnetized or may be interacting within magnetic fields.

In some embodiments, the alignment system 100 may apply an initial external magnetic field (Hex) to the wafer 114 to orient vectors of the resulting magnetic fields of the alignment markers 202. For instance, the alignment system 100 may apply an initial external magnetic field (Hex) to the wafer 114 to rotate all domains within the alignment markers 202 to be in known directions. As a result, and as is discussed in further detail below, orienting all the domains of the alignment markers 202 enables the alignment system 100 to determine (e.g., know, set, etc.) desired orientation of magnetic fields for each alignment marker 202 (e.g., a magnetic field that is expected to be emitted by each alignment marker 202 in response to being magnetized). Furthermore, applying the initial external magnetic field (Hex) to the wafer 114 forces the resulting magnetic fields of the alignment markers 202 to be oriented in a particular (e.g., selected) direction.

After applying the initial external magnetic field to the wafer 114, the alignment system 100 may apply an additional external magnetic field to the wafer 114 to at least partially magnetize the alignment markers 202 within the wafer 114. In some embodiments, the alignment system 100 may apply the additional external magnetic field to the wafer 114 in a particular direction. For example, the alignment system 100 may apply the additional external magnetic field to the wafer 114 in plane with the wafer 114. In other words, the alignment system 100 may apply the additional external magnetic field to the wafer 114 along a plane that is parallel to an upper surface of the wafer 114. In additional embodiments, the alignment system 100 may apply the additional external magnetic field to the wafer 114 out of plane with the wafer 114. Put another way, the alignment system 100 may apply the additional external magnetic field to the wafer 114 along a plane that is perpendicular to or forming an acute angle with the upper surface of the wafer 114.

In some embodiments, a direction in which the external magnetic field is emitted through the wafer 114 may be dependent on orientation of the alignment markers 202 within the wafer 114. For example, in one or more embodiments, the alignment system 100 may emit the external magnetic field in a direction that is parallel to or perpendicular to a direction extending from a first pole (e.g., north-seeking pole) of a given alignment marker 202 to a second pole (e.g., south-seeking pole) of the given alignment marker 202. As mentioned briefly above, the direction in which the external magnetic field is applied to the alignment markers 202 may determine expected responses of the alignment markers 202 (e.g., expected resulting magnetic fields of the alignment markers 202).

In one or more embodiments, the alignment system 100 may only apply a single external magnetic field to the wafer 114 to both orient the domains of the alignment markers 202 and to magnetize the alignment markers 202. In other words, the alignment system 100 may not apply a second subsequent external magnetic field to the wafer 114 in every embodiment.

As will be appreciated by one of ordinary skill in the art, applying an external magnetic field to a ferromagnetic and/or antiferromagnetic materials may cause residual (e.g., remanent) magnetic fields to be emitted by the alignment markers 202 even after removing the applied external magnetic field. For instance, the alignment markers 202 may maintain a remanence (e.g., remanent magnetization or residual magnetism). Furthermore, because the pattern 204 in which the alignment markers 202 were formed is known, and because the original orientation of the alignment markers 202 is known, the alignment markers 202 have expected pole locations, sizes, geometries, and orientations relative to one another and within the wafer 114. Referring to acts 302-306 together, in some embodiments, the pattern 204 and alignment markers 202 may be formed and the alignment system 100 may then be used to apply the external magnetic field to result in the poles of the alignment markers 202 being aligned along one of the axes of the Cartesian space defined above (e.g., the X-axis, Y-axis, or Z-axis). As a result, the alignment markers 202, after being magnetized, may have expected resulting magnetic fields.

Upon applying an external magnetic field, the method 300 may include determining (e.g., reading) locations of the alignment markers 202 within the wafer 114, as shown in act 308 of FIG. 3. In some embodiments, determining the locations of alignment markers 202 within the wafer 114 may include one or more of 1) measuring magnitudes of the magnetic fields (i.e., residual magnetic fields) emitted by the alignment markers 202 in a scalar form along one or more axes, as shown in act 308a, 2) calculating magnetic field strengths of the magnetic fields of the alignment markers 202 in a vector form along one or more axes, as shown in act 308b, and ultimately, 3) determining the locations of the alignment markers 202 responsive to data determined in acts 308a and/or 308b, as shown in act 308c. Furthermore, in some embodiments, act 306 of FIG. 3 (i.e., the act of applying a magnetic field to the wafer 114) may be repeated during and/or between any of the actions taken in act 308 to maintain and/or recreate magnetic fields within the alignment markers 202. If desired, act 308 may be repeated to verify the previously obtained data relating to alignment markers 202.

Figure 4:
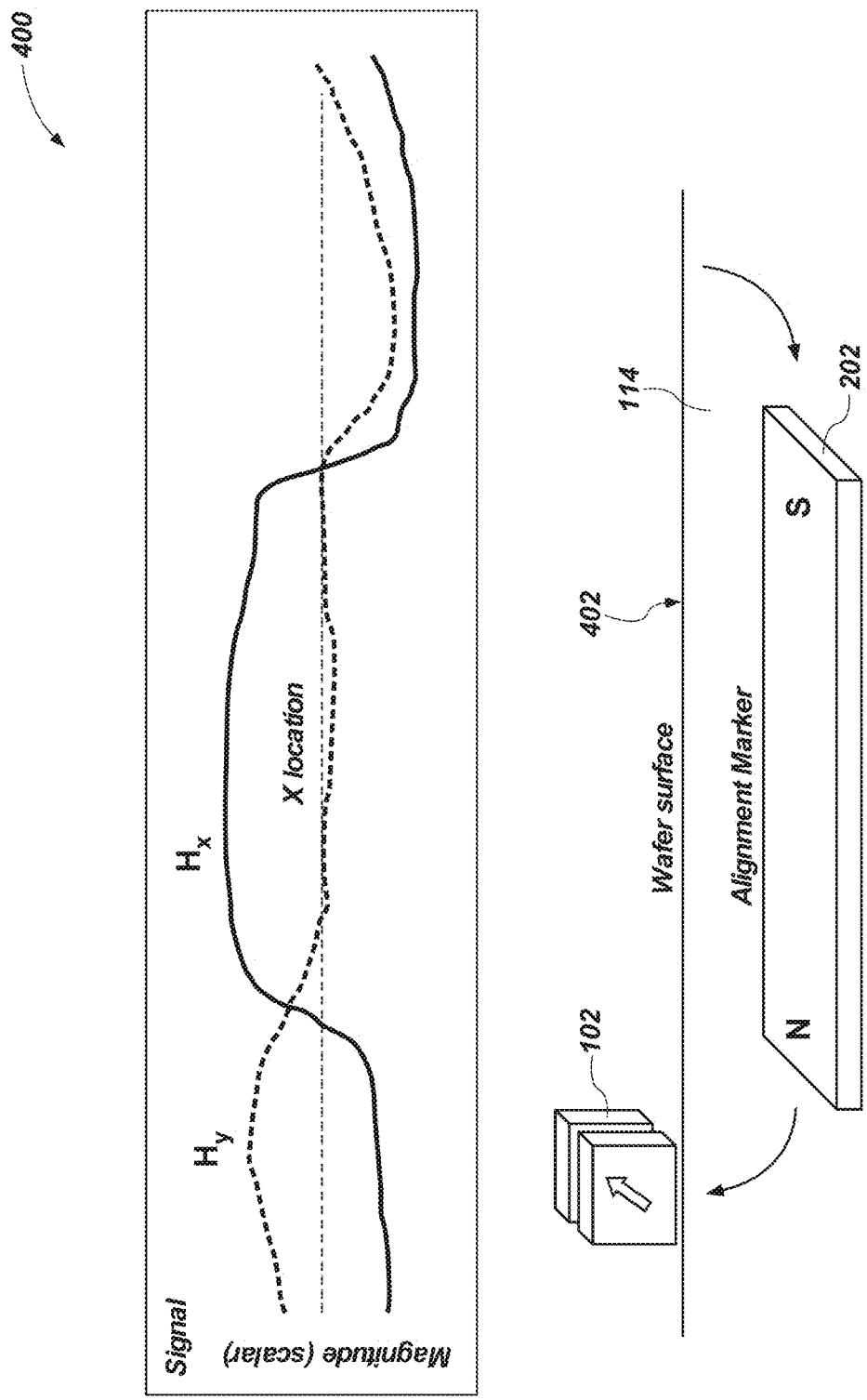
FIG. 4 is a schematic representation of a sensor oriented over an alignment marker within a wafer and a scalar magnitude of a measured magnetic field emitted by the alignment marker according to one or more embodiments of the present disclosure.

FIG. 4 is a schematic representation 400 of an alignment marker 202 within a wafer 114 and a sensor 102 of an alignment system (e.g., alignment system 100) disposed over the wafer 114. Additionally, FIG. 4 shows example scalar magnitudes of magnetic fields detected via the sensor 102 when passing the sensor 102 over an upper surface 402 of the wafer 114 and above the alignment marker 202 within the wafer 114. Referring to act 308a of FIG. 3 and FIG. 4 together, the alignment system 100 may pass the sensor 102 over the upper surface 402 of the wafer 114 to detect the magnetic fields emitted by the alignment markers 202 within the wafer 114. In some embodiments, the alignment system 100 may pass the sensor 102 over the wafer 114 along one or more of the X-axis, Y-axis, and/or Z-axis of the Cartesian space defined above in regard to FIG. 1. For instance, the alignment system 100 may pass the sensor 102 along the X-axis to detect magnitudes of magnetic fields emitted by the alignment markers 202 along the X-axis of the Cartesian space. As noted above, within the first set of embodiments, the sensor 102 may include one or more of a Hall Effect sensor, a GMR sensor, a TMR sensor, an EMR sensor, or a spin hall sensor.

In some embodiments, the alignment system 100 may pass the sensor 102 over the upper surface of the wafer 114 along multiple axes (e.g., both the X-axis and the Y-axis) of the Cartesian space to detect magnitudes and directions of a magnetic field emitted by a given alignment marker 202 within the wafer 114 along the multiple axes. In one or more embodiments, an expected location and orientation of a given alignment marker 202 (e.g., a location determined by the pattern 204 previously formed and material previously deposited to form the given alignment marker 202, as discussed above in regard to acts 302 and 304) stored in memory 122 may be used by processor 120 to determine where the alignment system 100 passes the sensor 102 over the wafer 114 and along which axes the alignment system 100 passes the sensor 102 to detect (e.g., search for) the magnetic field emitted by the given alignment marker 202.

Additionally, referring to act 308b of FIG. 3, as noted above, in some embodiments, determining locations of the alignment markers 202 within the wafer 114 may include calculating the magnetic field strengths of the magnetic fields emitted by the alignment markers 202 in vector form. In some embodiments, the alignment system 100 may calculate the magnetic field strengths of the magnetic fields emitted by the alignment markers 202 in vector form by approximating the magnetic fields as dipoles and/or surface magnetic moments. For example, FIG. 5 is a schematic representation 500 of an alignment marker 202 disposed within a wafer 114 and a sensor 102 of an alignment system (e.g., alignment system 100) disposed over the wafer 114.

Figure 5:
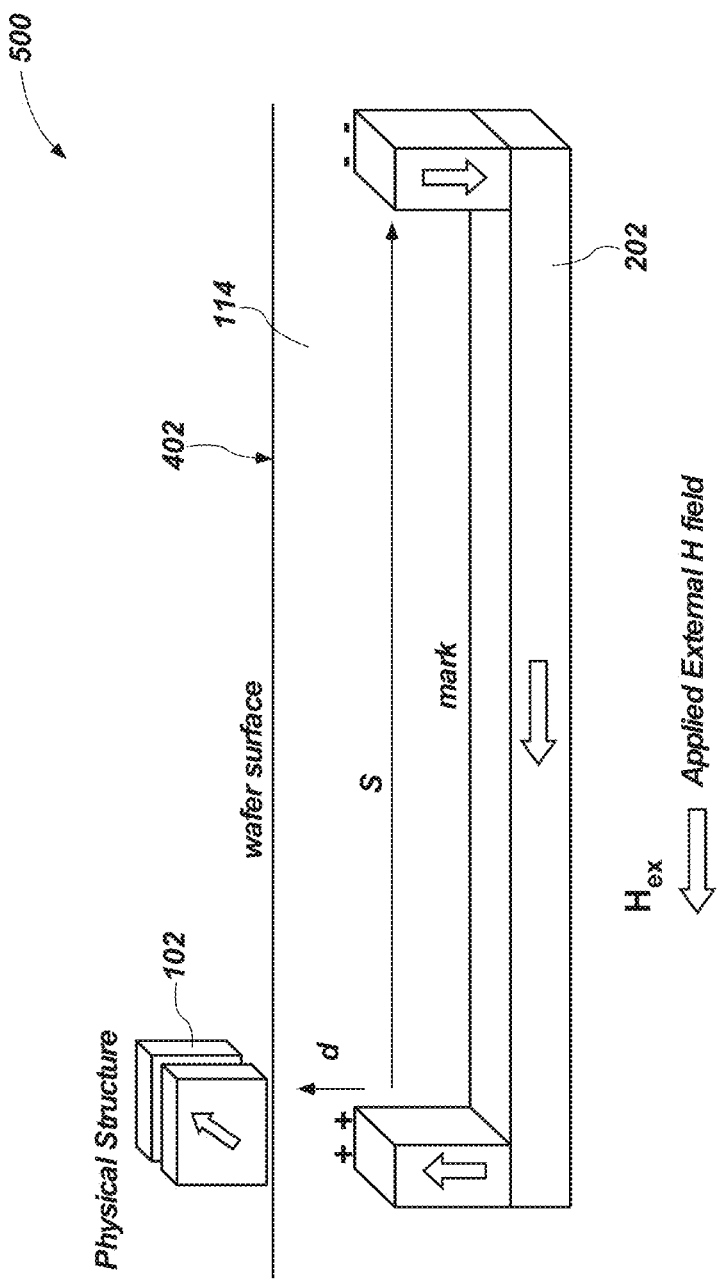
FIG. 5 is a schematic representation of a sensor over an alignment marker within a wafer according to one or more embodiments of the present disclosure.

Referring to FIGS. 3 and 5 together, the alignment system 100 may pass the sensor 102 over the upper surface 402 of the wafer 114 to detect the magnetic fields emitted by the alignment markers 202 within the wafer 114 via any of the manners described above in regard to FIG. 4. Furthermore, as will be understood by one of ordinary skill in the art, when the poles of the alignment markers 202 are closely spaced relative to an observation distance (d), the magnetic field strengths of the magnetic fields emitted by the alignment markers 202 can be approximated as dipoles $$\left(\frac{1}{r^3} \text{ dependence}\right).$$

Additionally, when the poles of the alignment markers 202 are widely spaced relative to the observation distance (d), the magnetic field strengths of the magnetic fields emitted by the alignment markers 202 can be approximated by the surface magnetic moment $$\left(\frac{1}{r^2} \text{ dependence}\right).$$

For instance, the magnetic field strength may be calculated via the following equation:

$$H_{dip} = \frac{1}{\mu_0} \frac{3(m*r)r - mr^2}{r^5}$$

where $H_{dip}$ is the magnetic field strength in vector form, r is the vector from the position of the dipole to the position where the magnetic field is being measured, r is the absolute value of r: the distance from the dipole, m is the vector dipole moment, and $\mu_0$ is the permeability of free space.

By utilizing the sensor 102 and passing the sensor 102 over the wafer 114 along multiple axes, processor 120 of the alignment system 100 may be used to calculate the magnetic field strengths of the magnetic fields emitted by the alignment markers 202 in vector form (e.g., Hx, Hy, and Hz) along one or more of the X-axis, the Y-axis, and the Z-axis of the Cartesian space. As a result, the alignment system 100 may calculate a representation of the magnetic fields in vectors. In some embodiments, the foregoing equation and approximations may drive the size and shape of the alignment markers 202 created via acts 302-306 of FIG. 3, and as a result, the pattern 204 formed in act 302 of FIG. 3. For instance, the size and shape of the alignment markers 202 (e.g., the pattern 204 for forming the alignment markers 202) may be designed to have resulting magnetic poles of the alignment markers 202 be widely or closely spaced such that the resulting magnetic fields can be approximated according to one of the above mentioned methods.

In some embodiments, the alignment system 100 may perform both acts 308a and 308b when determining a location of an alignment marker 202 within the wafer 114. In other embodiments, the alignment system 100 may perform only one of acts 308a and 308b when determining a location of an alignment marker 202 within the wafer 114. In other words, both of acts 308a and 308b are not required in every embodiment of the present disclosure.

The following are simulations of tests performed by the inventors within the scope of the first set of embodiments where the magnetic field strengths of magnetic fields emitted by alignment markers are calculated.

EXAMPLE 1

Figure 6:
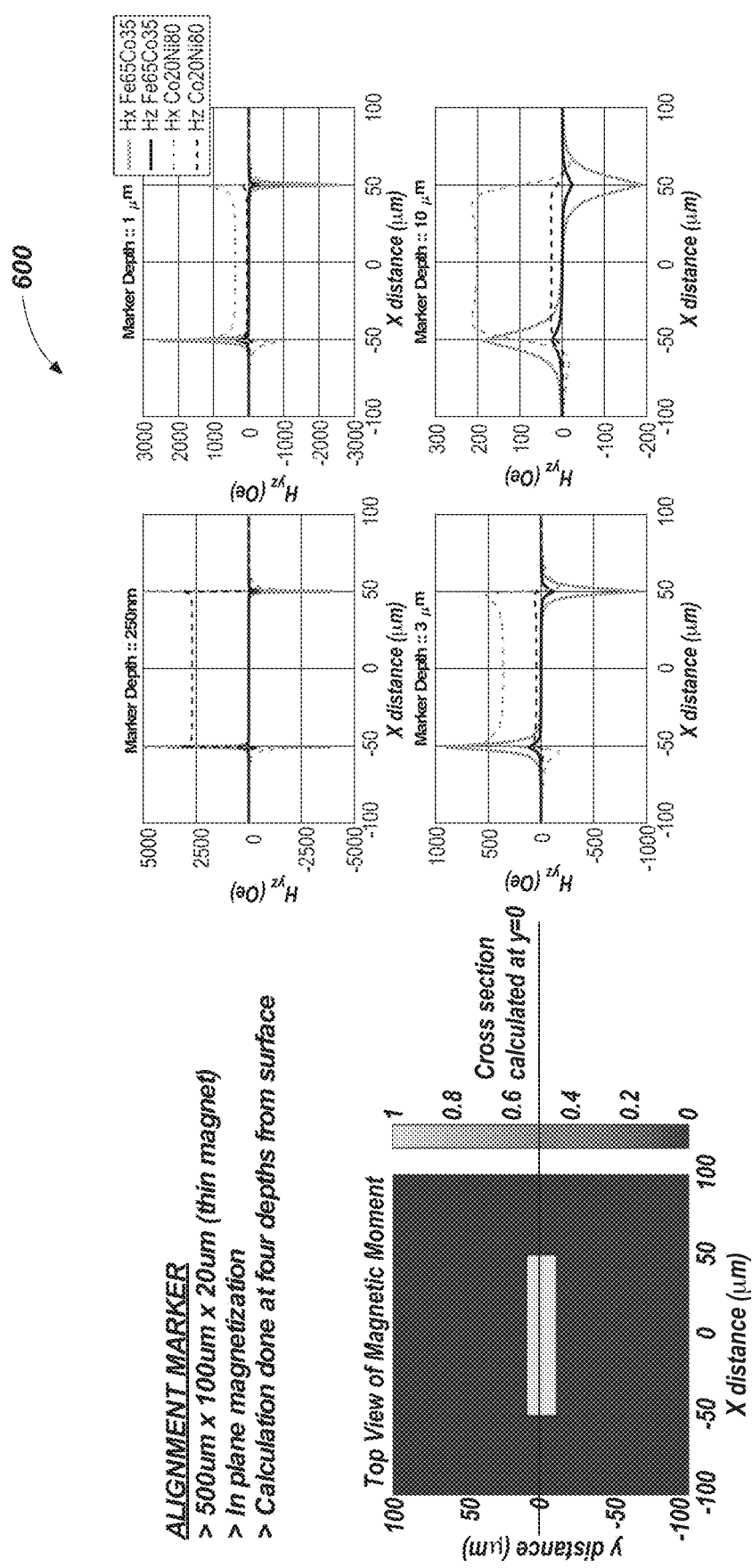
FIG. 6 shows example measurements acquired via testing performed by the inventors.

FIG. 6 shows testing results 600 from laboratory testing from a first example. Referring to FIGS. 3-6 together, in the laboratory tests, two types of 500 nm×100 μm×20 μm alignment markers (relatively thin specimen) were disposed within respective wafers. The first type of alignment marker included Fe65Co35, and the second type of alignment marker included Co20Ni80. Four alignment markers of the first type of alignment markers were disposed at varying depths (250 nm, 1 μm, 3 μm, and 10 μm) within four respective wafers. Additionally, four alignment markers of the second type of alignment markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafer). After subjecting the wafers to the magnetic field, the residual magnetic fields of the alignment markers were detected at the four correlating depths of the alignment markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 6) via one or more of the approximation methods described above.

EXAMPLE 2

Figure 7:
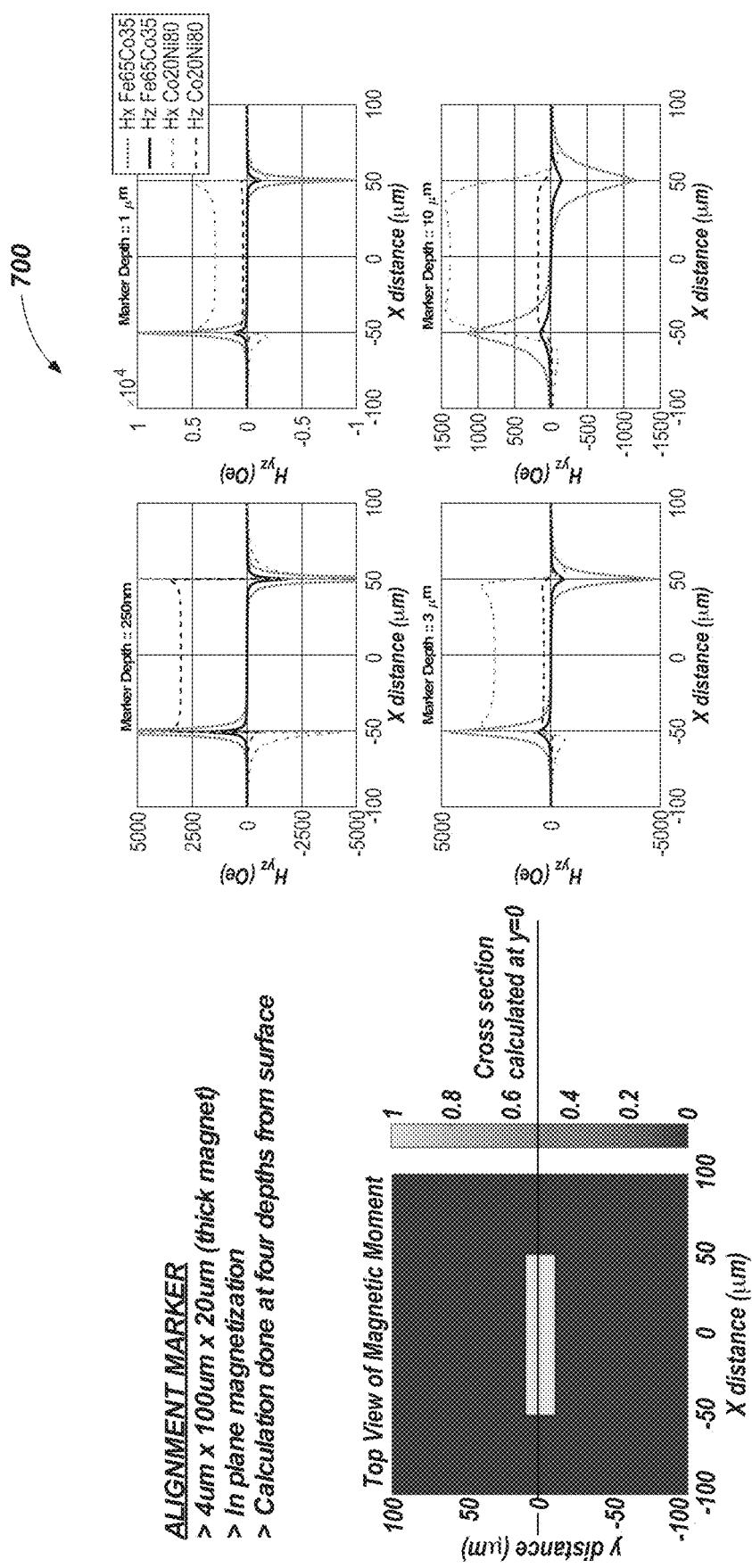
FIG. 7 shows example measurements acquired via testing performed by the inventors.

FIG. 7 shows testing results 700 from laboratory testing from a second example. Referring to FIGS. 3-5 and 7 together, in the laboratory tests, two types of 4.0 μm×100 μm×20 μm alignment markers (relatively thick specimen) were disposed within respective wafers. The first type of alignment marker included Fe65Co35, and the second type of alignment marker included Co20Ni80. Four alignment markers of the first type of alignment markers were disposed at varying depths (250 nm, 1 μm, 3 μm, and 10 μm) within four respective wafers. Additionally, four alignment markers of the second type of alignment markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafers). After subjecting the wafers to the magnetic field, the residual magnetic fields of the alignment markers were detected at the four correlating depths of the alignment markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 7) via one or more of the approximation methods described above.

EXAMPLE 3

Figure 8:
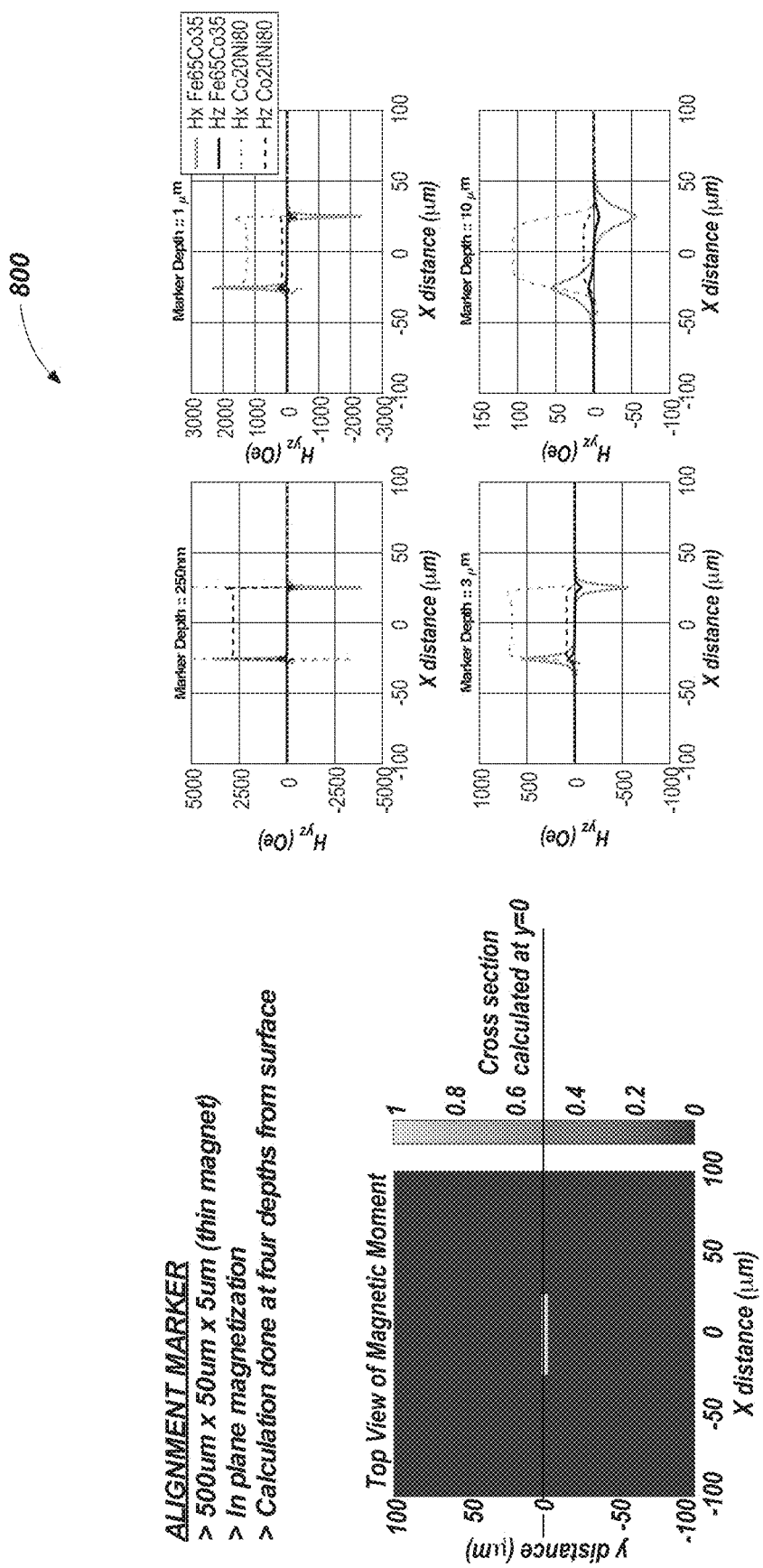
FIG. 8 shows example measurements acquired via testing performed by the inventors.

FIG. 8 shows testing results 800 from laboratory testing from a third example. Referring to FIGS. 3-5 and 8 together, in the laboratory tests, two types of 500 nm×50 μm×5 μm alignment markers (relatively thin specimen) were disposed within respective wafers. The first type of alignment marker included Fe65Co35, and the second type of alignment marker included Co20Ni80. Four alignment markers of the first type of alignment markers were disposed at varying depths (250 nm, 1 μm, 3 μm, and 10 μm) within four respective wafers. Additionally, four alignment markers of the second type of alignment markers were disposed at varying depths (250 nm, 1 μm, 3 μm, and 10 μm) within four respective wafers. All of the wafers were subjected to a magnetic field greater than 25 Oe. Furthermore, the wafers were subjected to an in plane magnetic field (e.g., magnetic field emitted in a direction parallel to a plane defined by an upper surface of a respective wafers). After subjecting the wafers to the magnetic field, the residual magnetic fields of the alignment markers were detected at the four correlating depths of the alignment markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 8) via one or more of the approximation methods described above.

EXAMPLE 4

Figure 9:
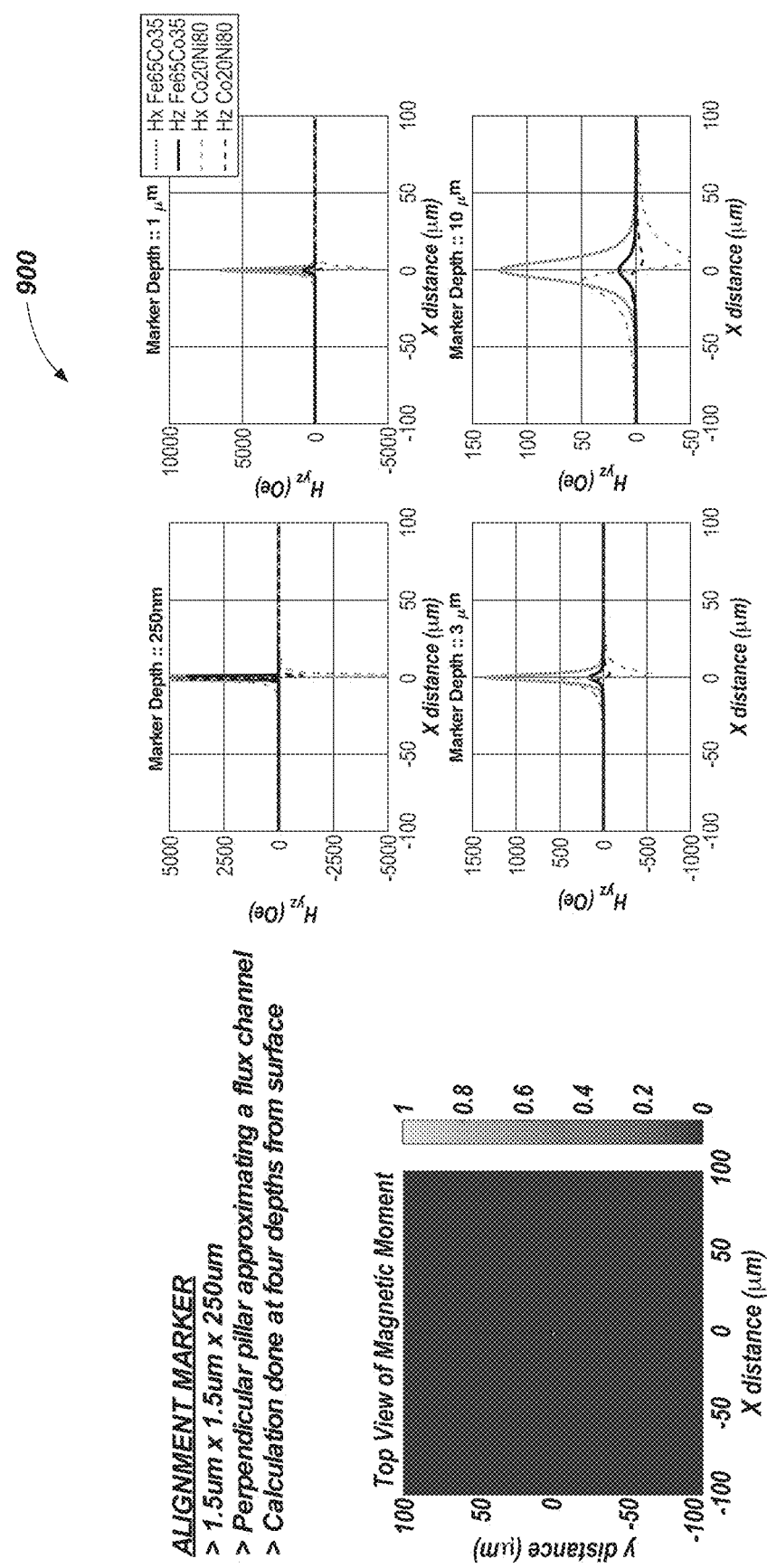
FIG. 9 shows example measurements acquired via testing performed by the inventors.

FIG. 9 shows testing results 900 from laboratory testing from a fourth example. Referring to FIGS. 3-5 and 9 together, in the laboratory tests, two types of 1.5 μm×1.5 μm×250 μm alignment markers (specimen shaped like a rod) were disposed within respective wafers in a direction perpendicular to EXAMPLES 1-3. The first type of alignment marker included Fe65Co35, and the second type of alignment marker included Co20Ni80. Four alignment markers of the first type of alignment markers were disposed at varying depths (250 nm, 1 μm, 3 μm, and 10 μm) within four respective wafers. Additionally, four alignment markers of the second type of alignment markers were disposed at varying depths (250 nm, 1 μm, 3 μm, and 10 μm) within four respective wafers. All of the wafers were subjected to a magnetic field greater than 25 Oe. Furthermore, the wafers were subjected to an out of plane magnetic field (e.g., magnetic field emitted in a direction perpendicular to a plane defined by an upper surface of a respective wafer). After subjecting the wafers to the magnetic field, the residual magnetic fields of the alignment markers were detected at the four correlating depths of the alignment markers (250 nm, 1 μm, 3 μm, and 10 μm) and along both the X-axis and the Z-axis utilizing one or more of the sensors described above. Furthermore, based on the detected magnetic fields, the correlating magnetic field strengths were calculated along both the X-axis and the Z-axis (shown in the associated graphs of FIG. 9) via one or more of the approximation methods described above.

Referring again to FIG. 3, based on data acquired and/or calculated via one or more of acts 308a and 308b (e.g., scalar and/or vector representations of the magnetic fields of the alignment markers 202 along axes of Cartesian space), the alignment system 100 may determine locations of the alignment markers 202 in three dimensions (e.g., in the X-axis, Y-axis, and Z-axis) within the wafer 114, as shown in act 308c of FIG. 3. In other words, in some embodiments, the alignment system 100 may determine the locations of the alignment markers 202 as vector plots.

In the first set of embodiments, as is mentioned briefly above, the geometries and original orientations and locations of the alignment markers 202 are known, and as a result, the alignment markers 202 have expected magnetic field profiles (e.g., three expected vector components of the magnetic field profiles). Furthermore, based on the expected magnetic fields of the alignment markers 202 and the actual measured/calculated magnetic fields of the alignment markers 202, the alignment system 100 may determine the actual locations of the alignment markers 202. For instance, as will be understood by one of ordinary skill in the art, the alignment system 100 may utilize significant features of known data such as, for example, known locations of minimums, maximum, zero crossing values, and maximum derivatives of the expected magnetic fields and original orientations of the alignment markers 202 within the ideal grid relative to significant features of measured and/or calculated data such as, for example, the actual calculated and/or measured minimums, maximums, zero crossing values, and maximum derivatives of the detected magnetic fields to determine locations (e.g., precise locations) of the alignment markers 202 within the wafer 114. As a non-limiting example, if an expected response signal is a sinusoidal response (e.g., FIG. 4) or other periodic response, the alignment system 100 may utilize the significant features of the expected response signal and significant features of the measured/calculated response signal to determine the actual location of the alignment markers 202.

Upon determining the locations of the alignment markers 202 within the wafer 114, the method 300 may further include aligning the wafer 114 for further semiconductor fabrication processes such as photolithographic processes based on the determined locations of the alignment markers 202 within the wafer 114, as shown in act 310 of FIG. 3. For example, the alignment system 100 may align the wafer 114 and/or tools or other components associated with the alignment system 100 based on the determined locations of the alignment markers 202. In some embodiments, the alignment system 100 may determine positional offsets (e.g., displacement data) of the alignment markers 202 relative to the ideal grid, and the processor 120 of alignment system 100 may apply mathematical modeling to the displacement data to generate a representation of the deviation of the wafer's position relative to the ideal grid. For example, the alignment system 100 may fit a simple partial differential equation to the vector plots of the alignment marker locations (e.g., a dx/dy equation) on various orders to determine coefficients of a standard polynomial equation (e.g., determine a geometrical transformation model). The geometrical transformation model can be utilized as a correction set for aligning the wafer 114 for further semiconductor fabrication processes.

For example, the alignment system 100 may be used to align the wafer and/or tools or other components associated with the alignment system 100 via conventional methods. For instance, the alignment system 100 may align the wafer and/or associated tools or components via any alignment algorithms known in the art. As a non-limiting example, the alignment system 100 may align the wafer and/or associated tools or components by calculating centers of the alignment markers 202 based on the determined locations of the alignment markers 202 and then determining whether the calculated centers of the alignment markers 202 are within tolerated dimensional ranges relative to the ideal grid (e.g., within a particular distance from a reference location of the ideal grid). For instance, the alignment system 100 may align the wafer and/or components of the alignment system 100 via any of manners described in U.S. Pat. No. 9,748,128, to Chao et al., filed Jun. 1, 2016, U.S. Pat. No. 6,068,954, to David, issued May 20, 2000, and U.S. Pat. No. 8,400,634, to Zhou et al., issued Mar. 19, 2013.

Additionally and after alignment, the method 300 may include exposing the wafer 114, as shown in act 312 of FIG. 3. For instance, act 312 may include one or more of spin coating a layer of a radiation-sensitive material (commonly referred to as a "photoresist") onto a surface of the wafer over a film of material, selecting exposing the wafer to radiation that chemically modifies a portion of the photoresist incident to the radiation, and removing either the exposed portion or the unexposed portion of the photoresist (depending on the positive or negative formulation of the photoresist) from the surface of the wafer with a developer to form a pattern of openings through the photoresist corresponding to the exposure pattern of the radiation. Subsequently, portions of the material film on the surface of the semiconductor wafer may be selectively removed. Alternatively, portions of a material may be deposited onto the surface of the wafer, through the openings of the photoresist mask. Although specific exposure procedures are described herein, the disclosure is not so limited. Rather, acts 308-310 of FIG. 3 may be performed before any further semiconductor fabrication processes that could benefit from the alignment processes described herein. Of course, acts 308-310 may be repeated between each semiconductor process act to ensure continued alignment of superimposed features of various levels.

The method 300 may, optionally, include demagnetizing the alignment markers 202, as shown in act 314 of FIG. 3.

For instance, the alignment markers 202 may be demagnetized by heating the alignment markers 202 past the alignment markers' Curie point (i.e., thermal erasure), applying an alternating current (i.e., AC current) through the alignment markers 202, permitting self-demagnetization, etc. Demagnetization of the wafer 114 may be desirable so as to not induce artifact into performance of integrated circuitry of semiconductor die locations during pre-singulation testing. Further, alignment markers 202 are located within semiconductor die locations, so as to not induce artifact into the performance of integrated circuitry components of dice singulated from the wafer 114, or into circuitry of other components located in close proximity to such semiconductor dice in higher-level packaging assemblies.

The method 300 for aligning a wafer described herein may provide advantages over conventional methods of aligning wafers. For example, because the method 300 utilizes magnetic fields emitted by alignment markers to determine the locations of the alignment markers (i.e., alignment markers) instead of optical methods, the method 300 is not hindered by opaque materials and/or multiple material levels disposed over the alignment markers, which often hinder conventional optical scanner alignment systems. Furthermore, the derived alignment positions (e.g., alignment models) are not influenced by a surface topography of a wafer, unlike conventional optical alignment systems. Additionally, because detecting the alignment markers is not based on optical detection (e.g., limited by image resolutions), the method 300 allows smaller marker sizes in comparison to conventional alignment systems. As a result, less wafer real estate may be required for (e.g., wasted on) alignment markers placed outside the die location areas of the wafer, potentially allowing for a greater number of die locations. Moreover, utilizing alignment markers may simplify downstream patching requirements and may provide more accurate alignment procedures in comparison to conventional systems. For instance, patching requirements do not need to be considered for open or closed status at any one particular photo level. In particular, substrates disposed over the alignment markers may remain closed all the times. Additionally, consideration on how to open an area of wafer or whether the wafer should be opened is unnecessary because determining the alignment markers' locations is not impacted by opacity of the substrates disposed over the alignment markers. As a result, the substrates disposed over the alignment markers may remain un-opened and ma maintain an at least substantially flat topography to alleviate other post processing topography issues that can cause non-uniformities in critical dimension patterns.

Second Set of Embodiments

Figure 10:
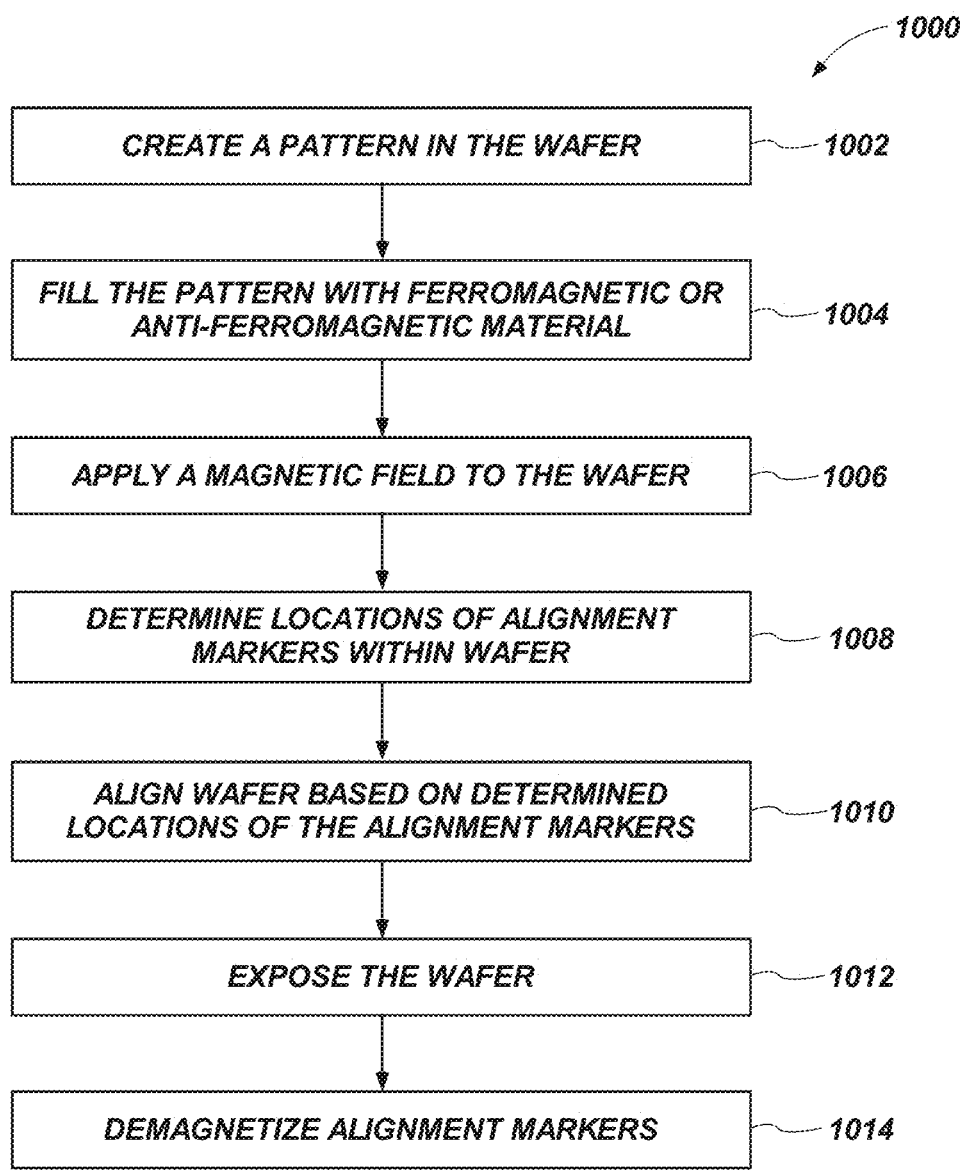
FIG. 10 is a flow diagram of a method of aligning a wafer according to one or more embodiments of the present disclosure.

FIG. 10 shows a schematic flow diagram of a method 1000 of aligning a wafer for semiconductor manufacturing processes according to a second set of embodiments of the present disclosure. As is described in greater detail below, the second set of embodiments may include procedures that involve determining locations of alignment markers 202 and an overall orientation of a wafer 114 responsive to measuring and/or detecting magnetizations (e.g., magnetization forces) of alignment markers 202 within the wafer 114 and aligning the wafer 114 responsive to the determined locations.

As shown in FIG. 10, similar to method 300 discussed above in regard to FIG. 3, the method 1000 includes creating recesses of pattern 204 in a surface (e.g., upper surface) of a wafer 114 (FIGS. 2A and 2B) by removing material from the wafer 114, as shown in act 1002. In some embodiments, the pattern 204 may be created by conventional lithographic processes and methods, as described above. Furthermore, in some embodiments, the created pattern 204 may correlate to (e.g., have the same size and shape as a pattern) an ideal grid (e.g., ideal pattern comprising ideal positions of the alignment markers 202, and ideal orientation of the wafer 114). As is known in the art, positions and locations of alignment markers within a wafer are conventionally compared to an ideal grid to determine alignment procedures and movements (e.g., alignment models). Furthermore, the alignment system 100 may form recesses of the pattern 204 such that resulting alignment markers 202 formed within the pattern 204 have particular geometric shapes. Accordingly, selected geometries and locations of the alignment markers 202 may be predetermined and implemented as described above.

The method 1000 may also include filling the pattern 204 with ferromagnetic and/or antiferromagnetic materials or any other material or structure capable of interacting with a magnetic field to form the alignment markers 202, as shown in act 1004 of FIG. 10. For instance, act 1004 may include filling the pattern 204 with any of the materials described above in regard to FIGS. 2A and 2B. Furthermore, recesses of the pattern 204 may be filled via conventional methods. For example, recesses of the pattern 204 may be filled via electroplating, electroless plating, physical vapor deposition, chemical vapor deposition, ion beam deposition, thin film deposition, etc. The surface of wafer 114 may then be subjected to a material removal process such as, for example, chemical mechanical planarization (CMP) to remove material from the wafer surface. In some embodiments, the alignment markers 202 may be formed via any of the methods described above in regard to FIG. 3.

After recesses of the pattern 204 are filled with ferromagnetic and/or antiferromagnetic materials and additional semiconductor fabrication processes are continued (e.g., depositing material, patterning, etching, etc.), the alignment system 100 and/or other tools may be employed to align wafer 114 prior to one or more particular semiconductor fabrication processes. For example, one or more materials (e.g., overlying material levels) may have already been formed over the alignment markers 202 of the wafer 114. As a result of such materials over the surface of wafer 114 and alignment markers 202, as well as movements of the wafer 114, known orientations of the wafer 114 and/or orientations and locations of the alignment markers 202 may be obscured but may be easily determined by the alignment system 100. As a result, any previously known positions of wafer 114 and features on the surface thereof may be redetermined and misalignment in future process acts avoided.

When initiating an alignment procedure, the method 1000 may include applying an external magnetic field to the wafer 114, as shown in act 1006. For instance, an external magnetic field may have already been applied to the wafer 114, or the alignment system 100 may apply an external magnetic field to the wafer 114 (e.g., subject the wafer 114 to a magnetic field) via the magnetic source 104 described above in regard to FIG. 1. For example, the alignment system 100 may supply a current through a coil of wire wrapped around an iron core to create an external magnetic field. In some embodiments, the alignment system 100 may supply a sufficient amount of current to create an external magnetic field having a strength greater than 25 Oe. Moreover, in some embodiments, the magnetic source 104 may be disposed within the sensor 102 of the alignment system 100. For instance, the magnetic source 104 may include an inductor. In one or more embodiments, the alignment system 100 may apply external magnetic fields to the wafer 114 on microscales or nanoscales. In one or more embodiments, the alignment system 100 may be used to apply the external magnetic field to a pristine, completely unprocessed (e.g., to form integrated circuitry) wafer 114 immediately following filling recesses of the pattern 204 with ferromagnetic and/or antiferromagnetic materials or any other material or structure capable of interacting with a magnetic field and before any further processing. In additional embodiments, alignment system 100 may apply the external magnetic field to the wafer 114 after one or more preceding semiconductor fabrication processes, for example, after optical alignment markers have become obscured, and prior to or while aligning the wafer 114 before additional semiconductor manufacturing processes. In some embodiments, applying the external magnetic field to the wafer 114 is optional. For instance, the alignment markers 202 may already be magnetized or may be interacting within magnetic fields.

In some embodiments, the alignment system 100 may apply an external magnetic field to the wafer 114 to magnetize the alignment markers 202 within the wafer 114. Furthermore, in some embodiments, the photolithography system 100 may drive a magnetization of the alignment markers 202 within the wafer 114. As noted above, applying an external magnetic field to ferromagnetic and/or antiferromagnetic materials may cause the alignment markers 202 to maintain a remanence (e.g., remanent magnetization or residual magnetism). Accordingly, as is discussed in greater detail below, in the second set of embodiments, the alignment system 100 may drive a magnetization (e.g., drive an AC magnetic force) of the alignment markers 202 and may measure a response (e.g., physical force response) responsive to whether or not magnetized materials (e.g., the alignment markers 202) are present in the wafer 114.

Upon applying an external magnetic field, the method 1000 may include determining (e.g., reading) locations of the alignment markers 202 within the wafer 114, as shown in act 1008 of FIG. 10. In some embodiments, determining the locations of alignment markers 202 within the wafer 114 may include measuring magnetizations of the alignment markers 202 within the wafer 114. As used herein the term "magnetization" may refer to a density of magnetic dipole moments that are induced in a magnetic material when the magnetic material is placed near a magnet (e.g., the alignment markers 202). In one or more embodiments, act 1006 of FIG. 10 (i.e., the act of applying a magnetic field to the wafer 114) may be repeated during and/or between any of the actions taken in act 1008 to maintain and/or drive magnetization of the alignment markers 202 within the wafer 114.

Figure 11:
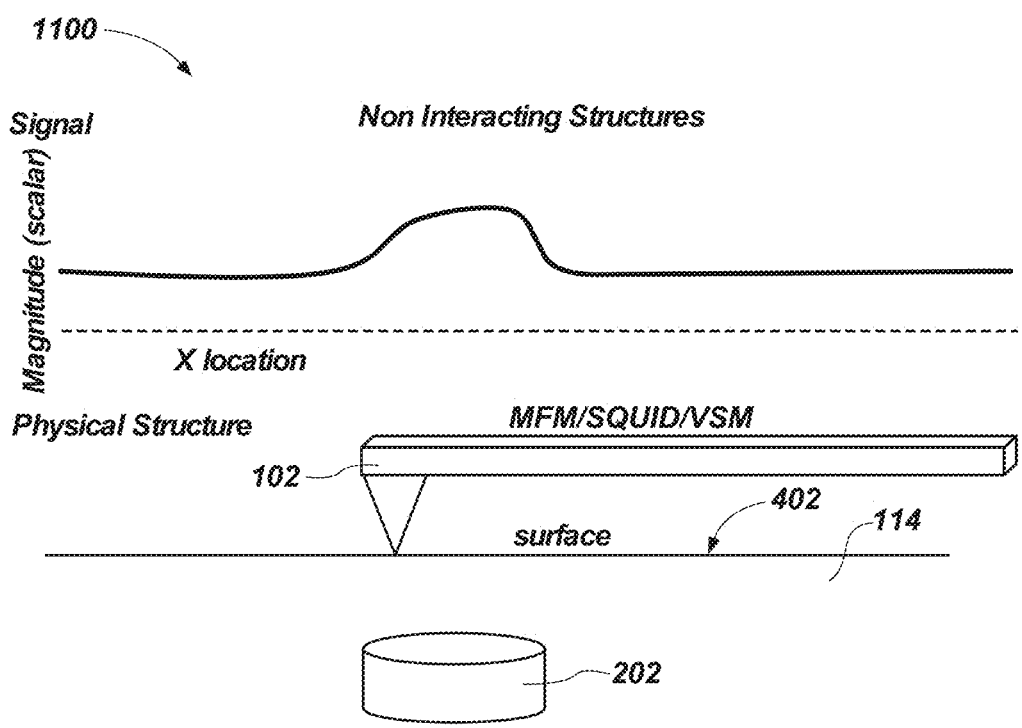
FIG. 11 is a schematic representation of a sensor oriented over an alignment marker within a wafer and a scalar magnitude of a measured magnetic field emitted by the alignment marker according to one or more embodiments of the present disclosure.
Figure 12:
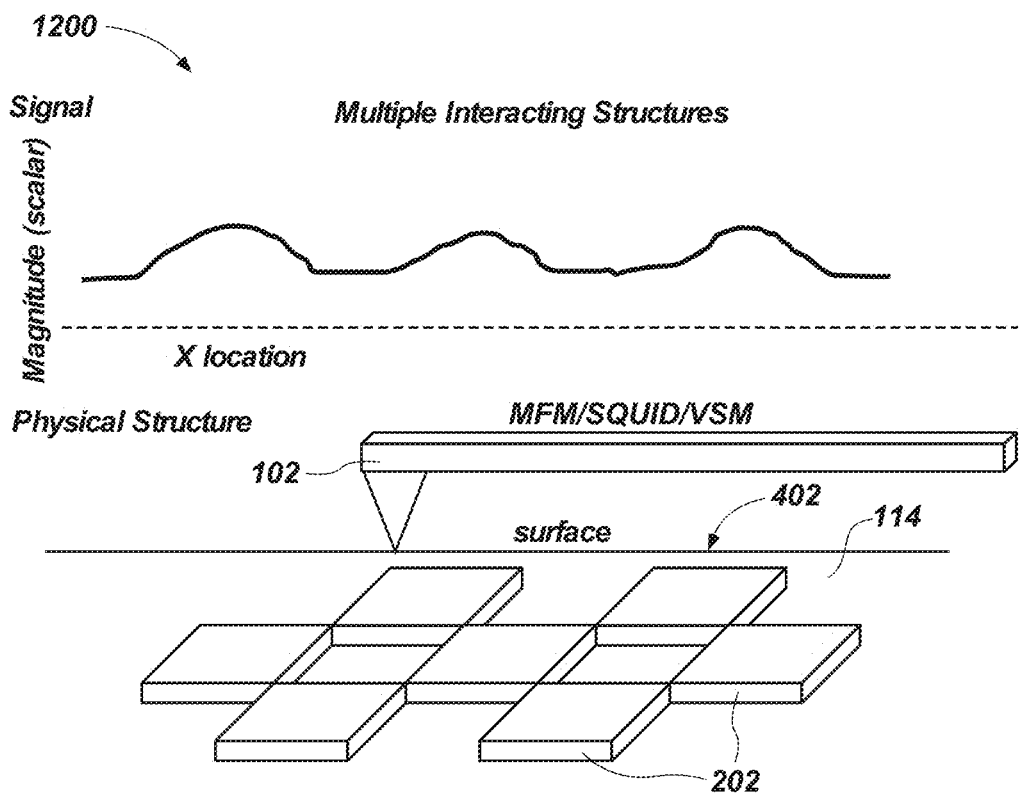
FIG. 12 is a schematic representation of a sensor over an alignment marker within a wafer and a scalar magnitude of a measured magnetic field emitted by the alignment marker according to one or more embodiments of the present disclosure.

FIGS. 11 and 12 are schematic representations 1100, 1200 of alignment markers 202 within wafer 114 and a sensor 102 of an alignment system (e.g., alignment system 100) disposed over the wafer 114. Additionally, FIGS. 11 and 12 show example scalar magnitudes of magnetizations of the alignment markers 202 detected via the sensor 102 when passing the sensor 102 over an upper surface 402 of the wafer 114 and above the alignment markers 202 within the wafer 114. As is discussed in greater detail below, utilizing data related to the magnetization of the alignment markers 202 to determine locations of the alignment markers 202 deems vector data unnecessary within the scope of the second set of embodiments. Referring to act 1008 and FIGS. 10-12 together, the alignment system 100 may pass the sensor 102 over the upper surface 402 of the wafer 114 to detect the magnetizations of the alignment markers 202 within the wafer 114. In some embodiments, the alignment system 100 may pass the sensor 102 over the wafer 114 along one or more of the X-axis, Y-axis, and/or Z-axis of the Cartesian space defined above in regard to FIG. 1. For instance, the alignment system 100 may pass the sensor 102 along the X-axis to detect magnitudes of the magnetizations of the alignment markers 202 along the X-axis of the Cartesian space. As noted above, within the second set of embodiments, the sensor 102 may include one or more of a MFM probe, SQUID, or VSM.

As a non-limiting example, in embodiments where the sensor 102 includes an MFM probe, the sensor 102 may include a sharp magnetized tip for scanning the alignment markers within the wafer 114. While passing the sensor 102 over the wafer 114, the alignment system 100 may detect interactions between the tip and the alignment markers 202 (e.g., deflections of the tip responsive to a magnetized marker). Furthermore, the alignment system 100 may utilize data from the interactions to reconstruct the magnetic structures of the alignment markers 202 (e.g., measure magnetization of the alignment markers 202). For example, both FIGS. 11 and 12 show measured responses (e.g., measured magnitudes of magnetization) acquired via the alignment system 100.

As another non-limiting example, in embodiments where the sensor 102 includes a VSM, the sensor 102 may include a driver coil and a search coil, and the process of measuring the magnetization may include vibrating (as is known in the art) the alignment marker 202 (e.g., the wafer 114). The driver coil (e.g., a first inductor) may be placed on a first side of an alignment marker 202, and the search coil (e.g., a second inductor) may be placed on an opposite second side of the alignment marker 202 forming a circuit. The driver coil may generate a magnetic field and may induce magnetization in the alignment marker 202 (which may be in addition to any magnetization already present). Additionally, the alignment marker 202 may be vibrated in a sinusoidal or other periodic motion. A magnetic field is emitted by the alignment marker 202 due to the magnetization, and the magnetization of the alignment marker 202 may be analyzed as changes occur in relation to the time of the movement (e.g., vibration) of the alignment marker 202. For instance, magnetic flux changes induce a voltage in the search coil that is proportional to the magnetization of the alignment marker 202. The induced voltage may be measured with a lock-in amplifier using a piezoelectric signal as a frequency reference, as is known in the art. Additionally, as is known in the art, changes in the measured signal (e.g., induced voltage) may be converted to values to determine (e.g., graph) the magnetization of the alignment marker 202 versus the magnetic field strength (known in the art as the Hysteresis loop).

In some embodiments, the alignment system 100 may pass the sensor 102 over the upper surface 402 of the wafer 114 along multiple axes (e.g., both the X-axis and the Y-axis) of the Cartesian space to detect a magnetization of a given alignment marker 202 within the wafer 114 along the multiple axes. In one or more embodiments, an expected location a given alignment marker 202 (e.g., a location determined by the pattern 204 previously formed and material previously deposited to form the given alignment marker 202, as discussed above in regard to acts 1002 and 1004 of FIG. 10) may determine where the alignment system 100 passes the sensor 102 over the wafer 114 and along which axes the alignment system 100 passes the sensor 102 to detect the magnetizations of the alignment markers 202.

Referring still to FIG. 10, based on the data acquired via act 1008 (e.g., scalar representations of the magnetizations of the alignment markers 202 along axes of the Cartesian space), the alignment system 100 may determine locations of the alignment markers 202 in three dimensions (e.g., in the X-axis, Y-axis, and Z-axis) within the wafer 114. For instance, as will be understood by one of ordinary skill in the art, the photolithography system 100 may utilize significant features of known data such as, for example, expected locations of the alignment markers 202 within the ideal grid relative to significant features of measured data such as, for example, the actual measured field vector and magnetization tensor, minimums, maximums, zero crossing values, $1^{st}$ and higher order derivatives, and maximum derivatives of the detected signals (e.g., magnetizations) to determine locations (e.g., precise locations) of the alignment markers 202 within the wafer 114. As a non-limiting example, if an expected response signal is a sinusoidal response (e.g., FIGS. 11 and 12) or other periodic response, the alignment system 100 may utilize the expected response signal and significant features of the measured response signal to determine the actual locations of the alignment markers 202.

As is depicted in FIGS. 10-12, determining locations of the alignment markers 202 by measuring magnetization of the alignment markers 202 may enable the alignment system 100 to determine locations of the alignment markers 202 that may have magnetic fields that are interacting with each other. Accordingly, by measuring magnetization of the alignment markers 202, the alignment system 100 may allow for alignment markers in close proximity to each other and having interacting magnetic fields to be located.

Upon determining the locations of the alignment markers 202 within the wafer 114, the method 1000 may further include aligning the wafer 114 for further semiconductor fabrication processes based on the determined locations of the alignment markers 202 within the wafer 114, as shown in act 1010 of FIG. 10. For example, the alignment system 100 may align the wafer 114 and/or tools or other components associated with the alignment system 100 based on the determined locations of the alignment markers 202. In some embodiments, the alignment system 100 may determine positional offsets (e.g., displacement data) of the alignment markers 202 relative to the ideal grid, and the processor 120 of alignment system 100 may apply mathematical modeling to the displacement data to generate a representation of the distortion of the wafer's position relative to the ideal grid. For example, the alignment system 100 may fit a simple partial differential equation to the vector plots of alignment marker locations (e.g., a dx/dy equation) on various orders to determine coefficients of a standard polynomial equation (e.g., determine a geometrical transformation model). The geometrical transformation model can be utilized as a correction set for aligning the wafer 114 for further processing (e.g., exposure). For example, the alignment system 100 may align the wafer and/or components of the alignment system 100 via any of the methods described above in regard to FIG. 3.

Additionally, the method 1000 may include exposing the wafer 114, as shown in act 1012 of FIG. 10. For instance, act 1012 may include exposing the wafer 114 via any of the methods described above in regard to FIG. 3. The method 1000 may, optionally, include demagnetizing the alignment markers, as shown in act 1014 via any of the manners described above in regard to FIG. 3 for reasons set forth above.

The method 1000 for aligning a wafer described herein may provide any of the advantages described in regard to FIGS. 3-9. Furthermore, because method 1000 operates by detecting and/or measuring the magnetization of the alignment markers 202 instead of the magnetic fields, the method 1000 does not depend on orientations of the magnetic moment of the alignment markers 202. For example, method 1000 permits arbitrary, while originally known, shapes and placements of the alignment markers 202 within the wafer 114. Accordingly, method 1000 may be advantageous when shapes and/or orientations of the alignment markers 202 are unknown and/or when orienting domains of the alignment markers 202 is proving difficult.

Third Set of Embodiments

Figure 13:
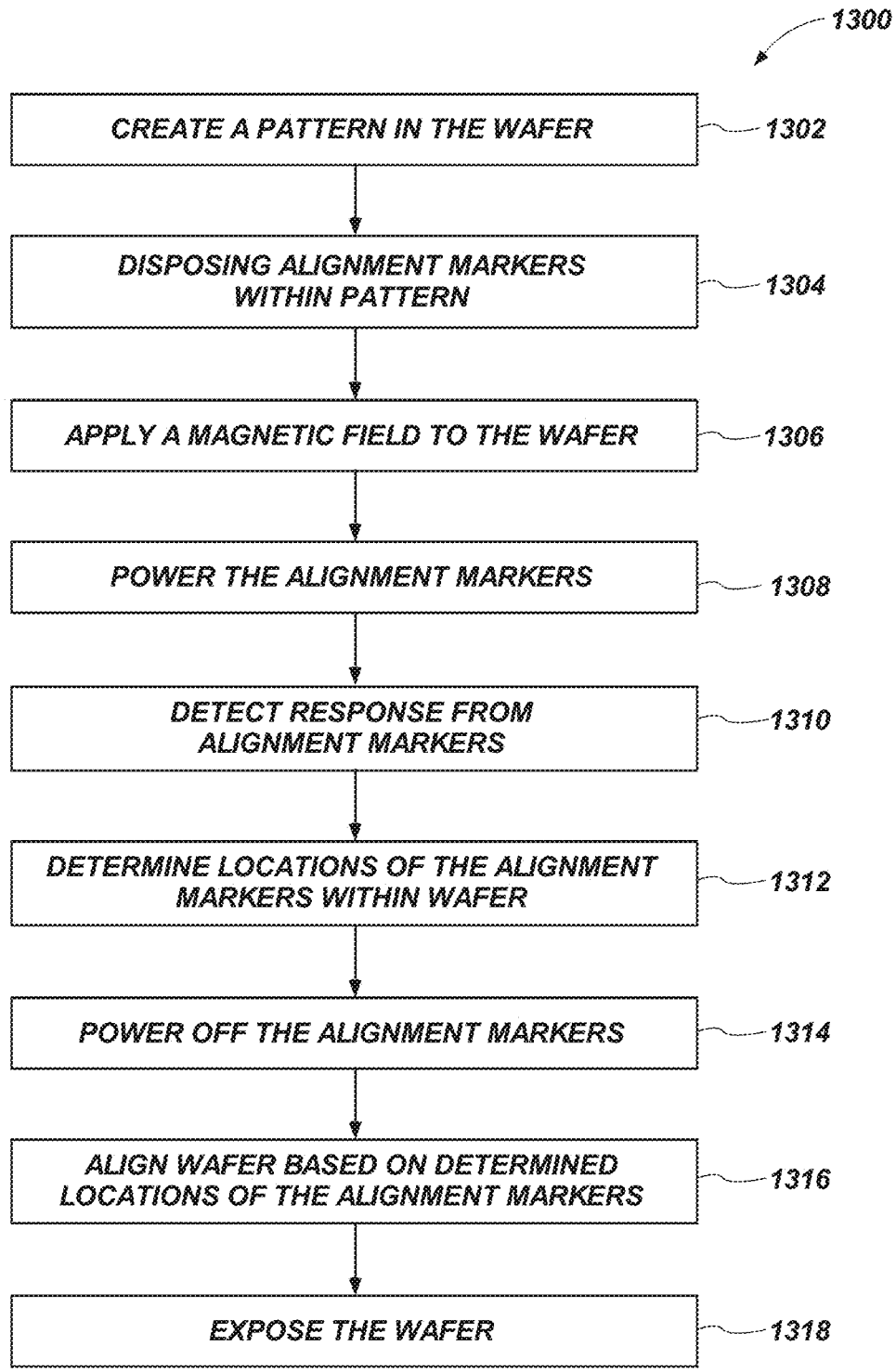
FIG. 13 is a flow diagram of a method of aligning a wafer according to one or more embodiments of the present disclosure.

FIG. 13 shows a schematic flow diagram of a method 1300 of aligning a wafer 114 for semiconductor manufacturing processes according to a third set of embodiments of the present disclosure. As is described in greater detail below, the third set of embodiments may include procedures that involve determining locations of alignment markers and an overall orientation of a wafer 114 responsive to powering the alignment markers, which each include one or more circuits within the wafer 114, with a magnetic field and measuring and/or detecting responses (e.g., signals, feedback, and/or magnetic fields) emanating from the alignment markers (e.g., one or more circuits) within the wafer 114 and aligning the wafer 114 responsive to the determined locations.

As shown in FIG. 13, similar to method 300 discussed above in regard to FIG. 3, the method 1300 includes creating a recesses in a pattern 204 in a surface (e.g., upper surface) of a wafer 114 by removing material from the wafer 114, as shown in act 1302. In some embodiments, the pattern 204 may be created via conventional lithographic processes and methods, as previously described. Additionally, the pattern 204 may correlate to an ideal grid, as discussed above in regard to FIGS. 3 and 10. Accordingly, the alignment system 100 may be used to determine locations of the alignment markers to be formed within the pattern 204.

As shown in FIG. 13, the method 1300 may further include disposing or fabricating alignment markers within recesses of the pattern 204, as shown in act 1304 of FIG. 13. Furthermore, each of the one or more alignment markers may include a circuit that can be powered inductively via a magnetic field. For instance, each of the one or more alignment markers may include any conventional receiving inductor for powering the circuit. Additionally, each of the one or more alignment markers may include microcircuitry or nanocircuitry or an inductively powerable MEMS device operably coupled to inductively-driven power circuitry.

In one or more embodiments, each alignment markers may include an antenna. For example, the alignment markers may include any conventional micro-antennae or nano-antennae. In additional embodiments, the one or more alignment markers may include components for producing AC magnetic fields. For instance, the one or more alignment markers may include one or more solenoids or coils for producing AC magnetic fields. Additionally, each alignment marker may be capable of emitting electromagnetic fields, DC magnetic fields, acoustic vibrations, thermal emissions, photon emissions, and/or other responses (vector or scalar). In some embodiments, the alignment marker 202 may include an array of antennae that may utilize beam shaping and/or other methods to control a directionality of radiation from the array of antennae. Additionally, the alignment marker 202 may drive a ferromagnetic core of flux channel that emits an AC magnetic field.

The method 1300 may further include applying an external magnetic field to the wafer 114, as shown in act 1306 of FIG. 13. In some embodiments, the alignment system 100 may apply the external magnetic field via the magnetic source 104. In one or more embodiments, the alignment system 100 may apply the external magnetic field to an entirety of the wafer 114. In additional embodiments, the alignment system 100 may apply the external magnetic field to only regions of the wafer 114. In further embodiments, the alignment system 100 may apply the external magnetic field to only an expected location of an alignment marker (e.g., a circuit). For instance, in some embodiments, the magnetic source 104 may be disposed within the sensor 102 or carried by the structure to which sensor 102 is mounted. As a non-limiting example, the magnetic source 104 may include a voltage source and an inductor. The voltage source may by coupled to the inductor (via traces, wires, etc.) to cause a voltage across the inductor, and as a result, cause the inductor to emit an external magnetic field around the inductor.

In response to applying an external magnetic field to the wafer 114, method 1300 may include powering the one or more of the alignment markers (e.g., one or more circuits) within the wafer 114, as shown in act 1308 of FIG. 13. For instance, the inductors of the one or more alignment markers may create voltages across the inductors in response to the applied external magnetic field, and the voltages may power the circuits of the one or more alignment markers. Powering the one or more alignment markers may result in signals being emitted by antennae of the one or more alignment markers, AC magnetic fields being emitted by coils of the one or more alignment markers, electromagnetic fields to be emitted by a coil of the one or more alignment markers, acoustic vibrations to be emitted by the one or more alignment markers, thermal emissions to be emitted by the one or more alignment markers, or other responses (vector or scalar) to be emitted by the one or more alignment markers.

Additionally, the method 1300 may include detecting and/or measuring the responses from the one or more alignment markers, as shown in act 1310 of FIG. 13. For instance, in some embodiments, detecting and/or measuring the responses from the one or more alignment markers may include detecting magnetic fields emitted by the one or more alignment markers via any of the manners described above in regard to FIGS. 1-12. In additional embodiments, detecting and/or measuring the responses from the one or more alignment markers may include receiving signals (e.g., radiofrequency signals, electromagnetic emissions, etc.) from antennae of the one or more alignment markers. In further embodiments, wherein alignment markers are configured as MEMS devices, vibrations may be initiated responsive to inductive power, and such vibrations, the magnitude, frequency and waveform thereof, may be detected and measured by sensor 102.

Furthermore, responsive to the detected and/or measured responses from the from the one or more alignment markers, the method 1300 may include determining locations of the one or more alignment markers within the wafer 114, as shown in act 1312 of FIG. 13. In some embodiments, determining locations of the one or more alignment markers within the wafer 114 may include determining a location of the sensor 102 over the wafer 114 relative to a remainder of the wafer 114. For instance, in operation and use, the magnetic source 104 may power a circuit within the wafer 114, and based on the response from the circuit, the alignment system 100 can determine where the sensor 102, magnetic source 104, and/or other tool of the alignment system 100 is located over the wafer 114. Additionally, in one or more embodiments, the alignment system 100 may determine the locations of the one or more alignment markers via any of the methods described above in regard to FIGS. 1-12.

Moreover, the method 1300 may include powering off the circuits via conventional methods, as shown in act 1314 of FIG. 13. Additionally, the method 1300 may include aligning the wafer 114 and/or the alignment system 100 as shown in act 1316 of FIG. 13 via any of the methods described above in regard to FIGS. 3 and 10. Likewise, the method 1300 may include exposing the wafer 114, as shown in act 1318 of FIG. 13 via any of the methods described above in regard to FIGS. 3 and 10.

Figure 14:
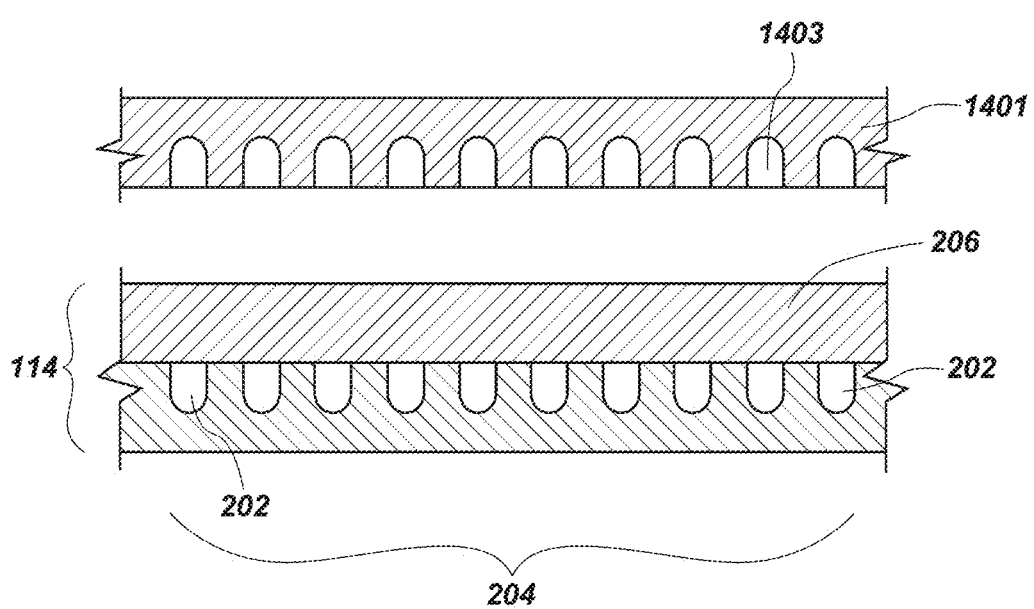
FIG. 14 is a schematic view of a sensor head of a registration system according to one or more embodiments of the present disclosure.

FIG. 14 is a schematic representation of a sensor head 1401 that may be utilized with the methods described in regard to FIG. 13. In some embodiments, as described above, the wafer 114 may include an array of alignment markers 202 within the wafer 114. Furthermore, the sensor head 1401 may include a complimentary set of markers 1403. For instance, the sensor head 1401 may include an inductive bridge circuit that may amplify small differences in coupling between two inductor pairs (e.g., correlating markers between the array of alignment markers 202 and the set of markers 1403 of the sensor head 1401). Additionally, the sensor head 1401 may be utilized via any of the manners described above in regard to FIG. 13.

Referring to FIGS. 1-14 together, additional embodiments of the present disclosure may include metal detector technologies for locating non-magnetized alignment markers, placing the alignment markers within die, and unique alignment marker designs with fewer design constraints than conventional, only visually detectable alignment markers.

An embodiment of the present disclosure includes a wafer comprising a semiconductor material, and one or more alignment markers comprising at least one of a ferromagnetic material or an antiferromagnetic material or any other material or structure capable of interacting with a magnetic field.

One or more embodiments of the present disclosure include a method of aligning a wafer. The method may include applying a magnetic field to a wafer, detecting residual magnetic fields from one or more alignment markers within the wafer, responsive to the detected residual magnetic fields, determining locations of the one or more alignment markers, determining a geometrical transformation model for aligning the wafer, and aligning the wafer responsive to the geometrical transformation model.

Some embodiments of the present disclosure include a method of aligning a wafer. The method may include driving magnetization of at least one alignment marker within a wafer, measuring the magnetization of the at least alignment marker, responsive to the magnetization of the at least one alignment marker, determining a location of the at least one alignment markers relative to an ideal grid, determining a geometrical transformation model for aligning the wafer, and aligning the wafer responsive to the geometrical transformation model.

One or more embodiments of the present disclosure include a method of aligning a wafer. The method may include applying a magnetic field to a wafer having one or more alignment markers comprising a ferromagnetic or antiferromagnetic material or any other material or structure capable of interacting with a magnetic field, detecting one or more magnetic attributes of the one or more alignment markers with a sensor, and responsive to the one or more magnetic attributes, determining locations of the one or more alignment markers.

Some embodiments of the present disclosure include an alignment system. The alignment system may include a substrate support for supporting a wafer, a sensor movable over the wafer and configured to detect magnetic attributes of alignment markers within the wafer, and a controller. The controller may be operably coupled to the substrate support, the magnetic source, and the sensor. The controller may include at least one processor and at least one non-transitory computer-readable storage medium storing instructions thereon that, when executed by the at least one processor, cause the controller to receive data related to detected magnetic attributes of the alignment markers from the sensor, and responsive to the received data, determine locations of the alignment markers within the wafer.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. An alignment system, comprising:
a substrate support for supporting a wafer;
a sensor movable over the wafer and configured to detect magnetic attributes of alignment markers within the wafer; and
a controller operably coupled to the substrate support and sensor, the controller comprising:
at least one processor; and
at least one non-transitory computer-readable storage medium storing instructions thereon that, when executed by the at least one processor, cause the controller to:
receive data related to detected magnetic attributes of the alignment markers from the sensor; and
responsive to the received data, determine locations of the alignment markers within the wafer.

2. The alignment system of claim 1, wherein the controller further comprises instructions that, when executed by the at least one processor, cause the controller to determine locations of the alignment markers within the wafer relative to an ideal grid.

3. The alignment system of claim 2, wherein the controller further comprises instructions that, when executed by the at least one processor, cause the controller to calculate a geometrical transformation model for aligning the wafer relative to the ideal grid.

4. The alignment system of claim 3, wherein the controller further comprises instructions that, when executed by the at least one processor, cause the controller to align the wafer using the substrate support based at least partially on the geometrical transformation model.

5. The alignment system of claim 3, wherein the controller further comprises instructions that, when executed by the at least one processor, cause the controller to align the wafer using the substrate support responsive to the determined locations of the alignment markers.

6. The alignment system of claim 1, wherein the sensor is selected from the group consisting of a MFM probe, a SQUID, or VSM.

7. The alignment system of claim 1, wherein the sensor is selected from the group consisting of a Hall Effect sensor, a GMR sensor, a TMR sensor, an EMR sensor, or a spin hall sensor.

8. The alignment system of claim 1, further comprising a magnetic source located and configured to apply a magnetic field to at least a portion of a wafer carried on the substrate support.

9. The alignment system of claim 8, wherein the magnetic source comprises an electro magnet.

10. The alignment system of claim 1, wherein the sensor is configured to detect residual magnetic fields emitted by the alignment markers.

11. The alignment system of claim 1, wherein the sensor is configured to detect magnetizations of the alignment markers.

12. A wafer comprising:
a substrate comprising a semiconductor material; and
one or more alignment markers comprising at least one of a ferromagnetic material or an antiferromagnetic material or any other material or structure detectable responsive to exposure to a proximate magnetic field.

13. The wafer of claim 12, wherein the one or more alignment markers comprise a pattern of recesses formed in a surface of the wafer, the pattern of recesses being at least partially filled with at least one of the ferromagnetic material, the antiferromagnetic material, or any other material or structure detectable responsive to exposure to a proximate magnetic field.

14. The wafer of claim 12, wherein the one or more alignment markers have longitudinal ends aligned along one of an X-axis, a Y-axis, or a Z-axis of a Cartesian space.

15. A wafer comprising:
a substrate comprising a semiconductor material; and
one or more alignment markers comprising one or more inductively powerable circuits within recesses of a pattern within the substrate.

16. An alignment system, comprising:
a substrate support for supporting a wafer;
a sensor movable over the wafer and configured to detect responses of alignment markers within the wafer;
a magnetic source located and configured to apply a magnetic field to at least a portion of the wafer or drive a magnetization of the alignment markers within the wafer; and
a controller operably coupled to the substrate support and sensor, the controller comprising:
at least one processor; and
at least one non-transitory computer-readable storage medium storing instructions thereon that, when executed by the at least one processor, cause the controller to:
receive data related to detected responses of the alignment markers from the sensor; and
responsive to the received data, determine locations of the alignment markers within the wafer.

17. The alignment system of claim 16, wherein the controller further comprises instructions that, when executed by the at least one processor, cause the controller to determine locations of the alignment markers within the wafer relative to an ideal grid based at least partially on the responses of the alignment markers.

18. The alignment system of claim 17, wherein the controller further comprises instructions that, when executed by the at least one processor, cause the controller to calculate a geometrical transformation model for aligning the wafer relative to the ideal grid.

19. The alignment system of claim 18, wherein the controller further comprises instructions that, when executed by the at least one processor, cause the controller to cause the alignment system to align the wafer responsive to the geometrical transformation model.

20. The alignment system of claim 16, wherein the responses of the alignment markers comprise one or more of residual magnetic fields, magnetization, or photon emissions.

* * * * *